United States Patent
Taito et al.

(10) Patent No.: US 7,414,912 B2
(45) Date of Patent: Aug. 19, 2008

(54) SEMICONDUCTOR FLASH MEMORY

(75) Inventors: Yasuhiko Taito, Tokyo (JP); Naoki Otani, Tokyo (JP); Kayoko Omoto, Tokyo (JP); Kenji Koda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/766,133

(22) Filed: Jun. 21, 2007

(65) Prior Publication Data

US 2007/0242521 A1 Oct. 18, 2007

Related U.S. Application Data

(62) Division of application No. 10/930,873, filed on Sep. 1, 2004, now Pat. No. 7,251,165.

(30) Foreign Application Priority Data

Sep. 17, 2003 (JP) .............................. 2003-324853
Apr. 21, 2004 (JP) .............................. 2004-125976

(51) Int. Cl.
*G11C 8/00* (2006.01)

(52) U.S. Cl. .............................. 365/230.03; 365/230.06; 365/230.01; 365/226; 365/185.11

(58) Field of Classification Search ............ 365/230.03, 365/230.06, 230.01, 226, 185.11
See application file for complete search history.

(56) References Cited

U.S. PATENT DOCUMENTS

| | | | |
|---|---|---|---|
| 5,448,518 A | | 9/1995 | Jinbo |
| 5,450,354 A | | 9/1995 | Sawada et al. |
| 5,487,036 A | | 1/1996 | Akaogi et al. |
| 5,563,827 A | * | 10/1996 | Lee et al. ............... 365/185.23 |
| 5,848,000 A | * | 12/1998 | Lee et al. ............... 365/185.23 |
| 5,867,429 A | | 2/1999 | Chen et al. |
| 5,898,637 A | * | 4/1999 | Lakhani et al. ........ 365/230.06 |
| 5,914,896 A | * | 6/1999 | Lee et al. ............... 365/185.19 |
| 6,052,303 A | | 4/2000 | Chevallier et al. |
| 6,118,695 A | | 9/2000 | Yoneyama |
| 6,181,602 B1 | | 1/2001 | Campardo et al. |
| 6,233,173 B1 | | 5/2001 | Chevalller et al. |
| 6,256,702 B1 | | 7/2001 | Yoneyama |
| 6,307,787 B1 | | 10/2001 | Al-Shamma et al. |
| 6,347,052 B1 | | 2/2002 | Akaogi et al. |
| 6,430,077 B1 | | 8/2002 | Eitan et al. |
| 6,449,204 B1 | | 9/2002 | Arimoto et al. |

(Continued)

FOREIGN PATENT DOCUMENTS

JP 7-57487 3/1995

(Continued)

*Primary Examiner*—Viet Q Nguyen
(74) *Attorney, Agent, or Firm*—Leydig, Voit & Mayer, Ltd.

(57) ABSTRACT

A semiconductor flash memory includes an erase/write control unit that, when performing an erase/write operation of read memory cells, reads and senses memory current of the read memory cells for each memory cell, and adjusts threshold voltage of each of the read memory cells to a predetermined value, and a readout control unit that, when performing a read operation, selects at least two read memory cells simultaneously from among the read memory cells to which the erase/write control unit stored the same data, and senses total memory current for the at least two read memory cells.

6 Claims, 22 Drawing Sheets

U.S. PATENT DOCUMENTS

| | | |
|---|---|---|
| 6,487,114 B2 | 11/2002 | Jong et al. |
| 6,621,761 B2 | 9/2003 | Akaogi et al. |
| 6,655,758 B2 | 12/2003 | Pasotti et al. |
| 6,687,157 B1 * | 2/2004 | Liu et al. ............... 365/185.09 |
| 6,781,877 B2 | 8/2004 | Cernea et al. |
| 6,795,349 B2 | 9/2004 | Cernea |
| 6,829,165 B2 | 12/2004 | Kanai |
| 6,934,195 B2 | 8/2005 | Cernea |
| 7,023,720 B2 * | 4/2006 | Maruyama ................. 365/145 |
| 7,251,165 B2 | 7/2007 | Taito et al. |

FOREIGN PATENT DOCUMENTS

| | | |
|---|---|---|
| JP | 10-27482 | 1/1998 |
| JP | 11-96782 | 4/1999 |
| JP | 2001-43691 | 2/2001 |

* cited by examiner

FIG.2

| CELL STATUS | ERASE STATUS ("H") | WRITE STATUS ("L") |
|---|---|---|
| CELL I-V CHARACTERISTICS | | |
| CELL READ | CHANNEL CURRENT FLOWS | CHANNEL CURRENT DOES NOT FLOW |

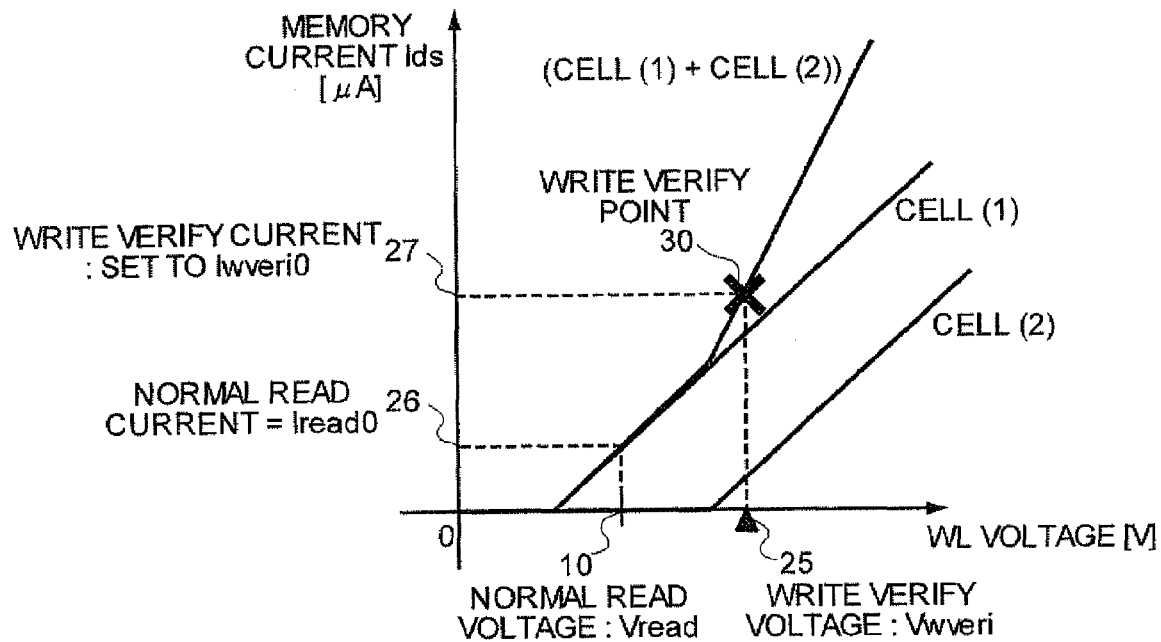
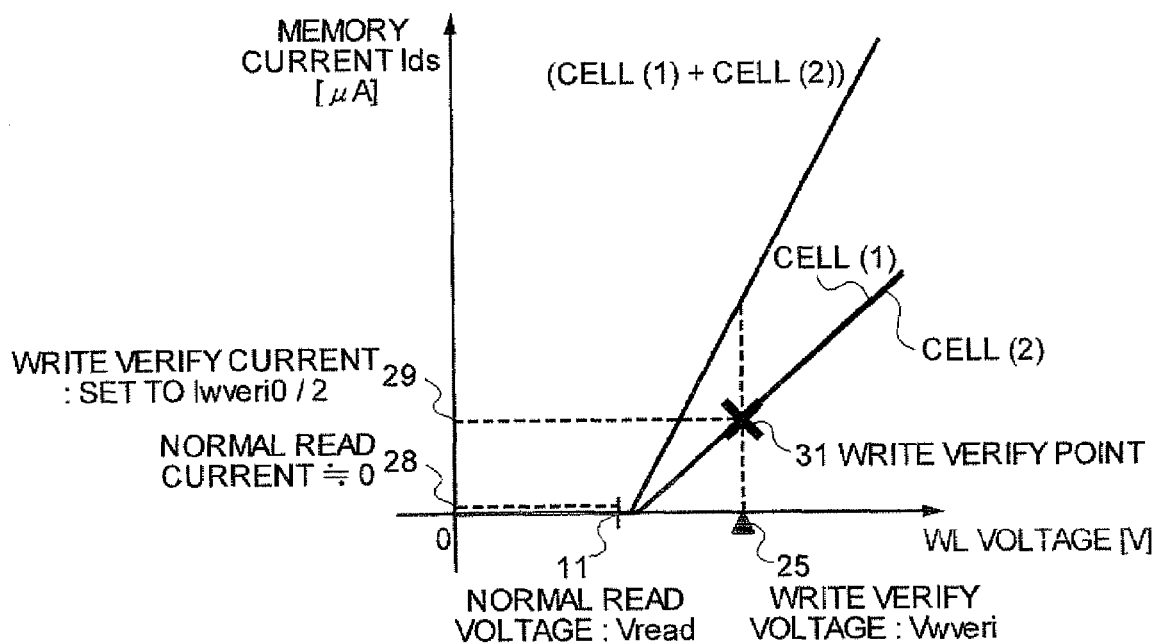

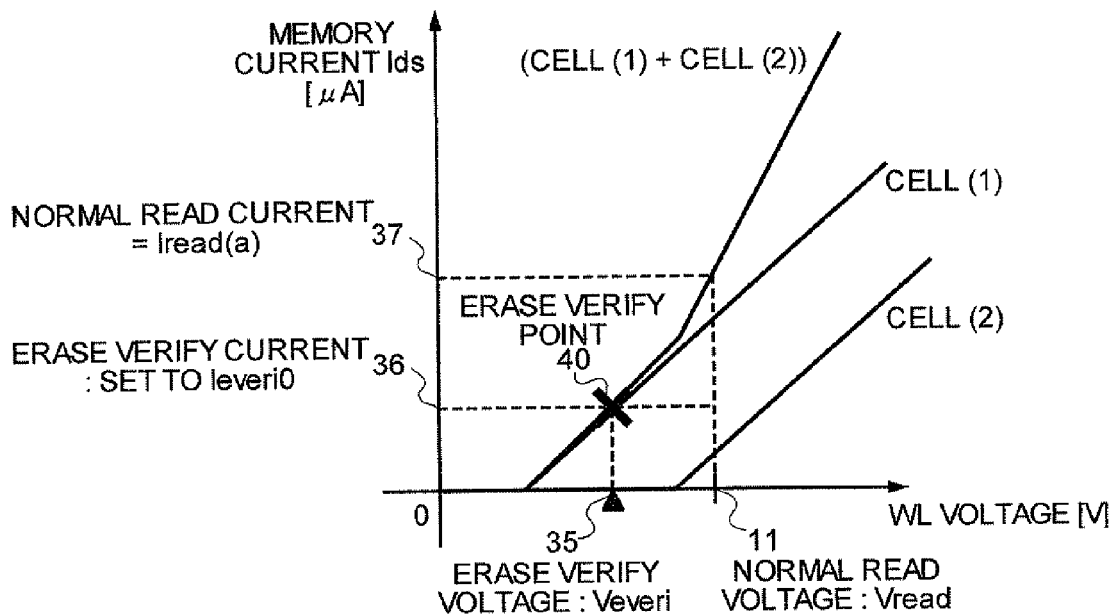
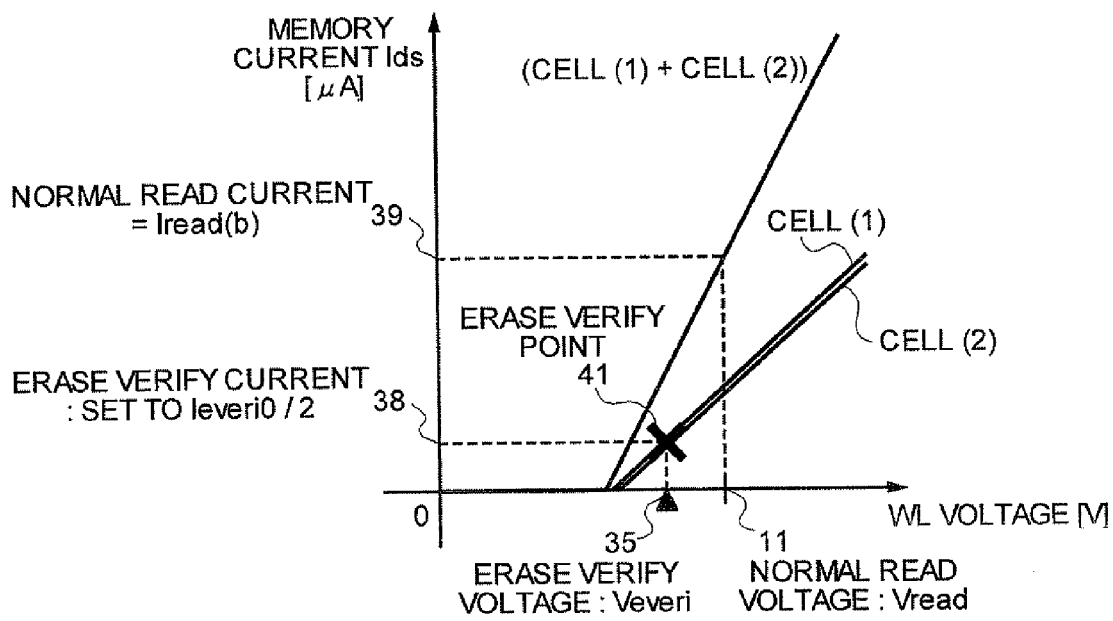

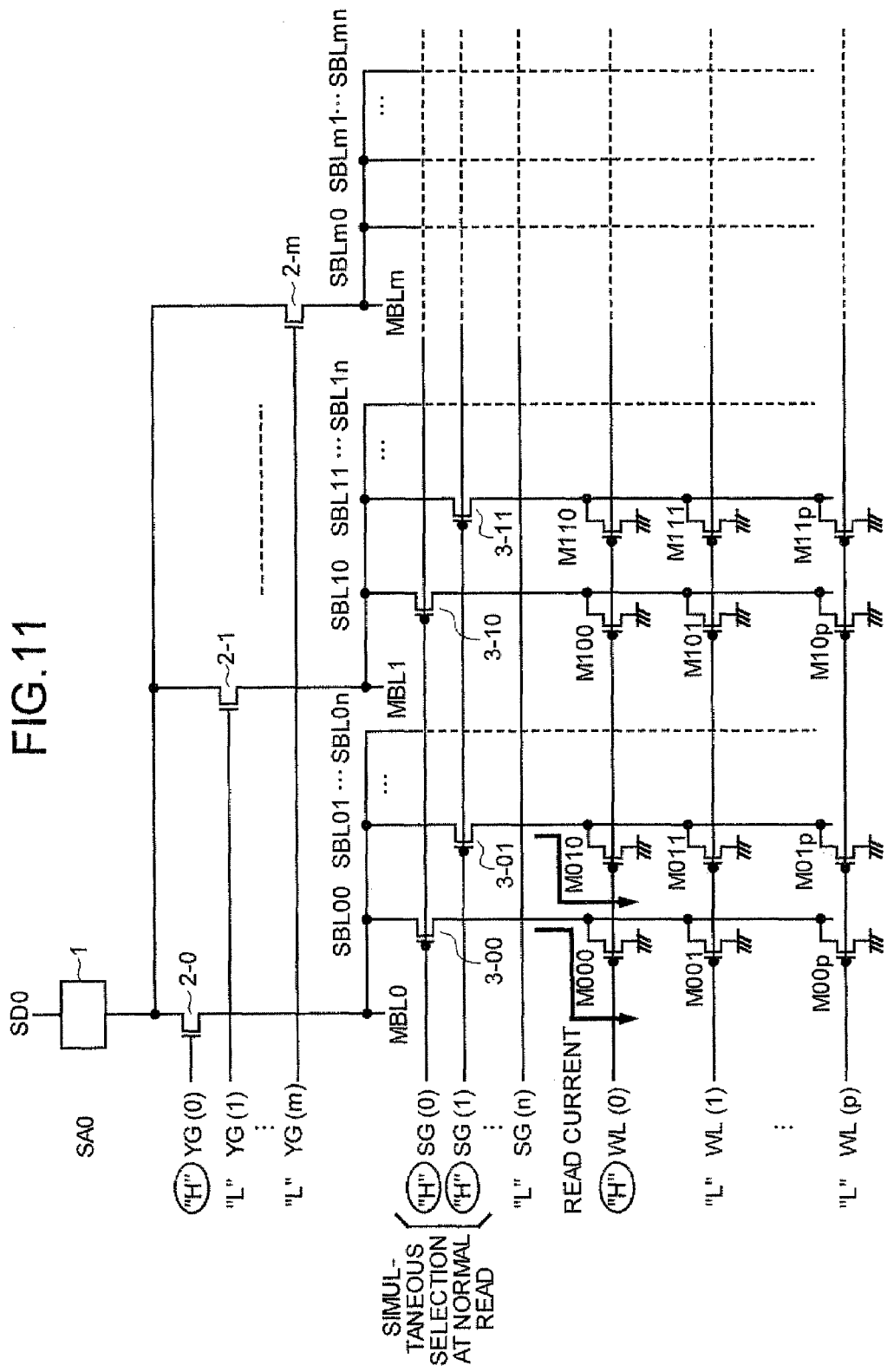

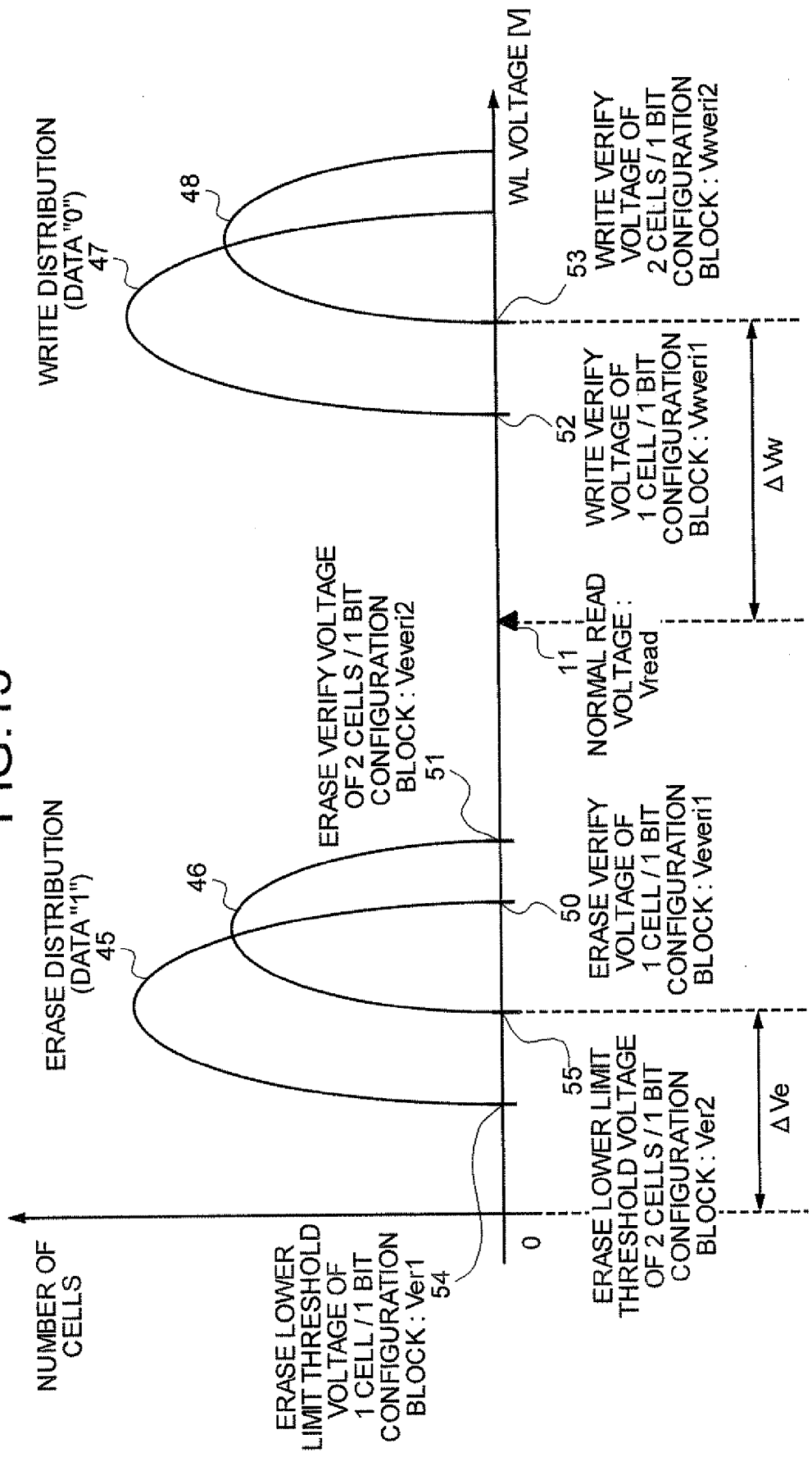

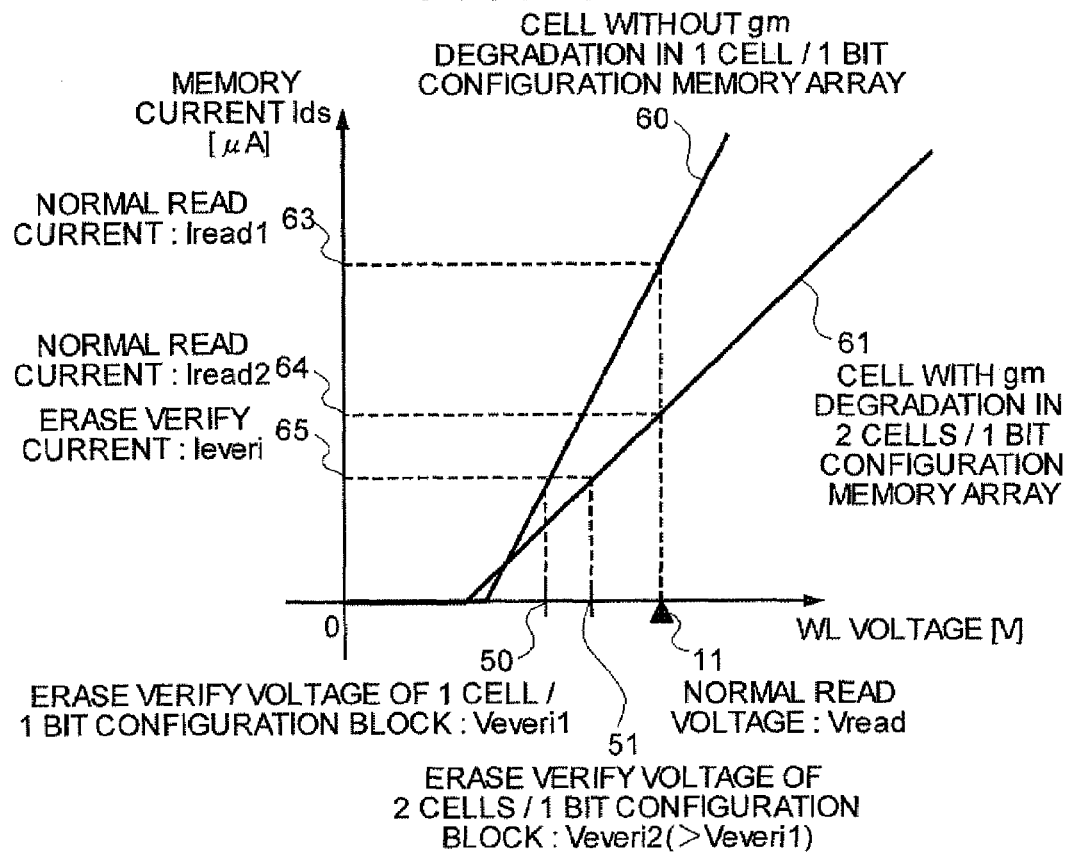
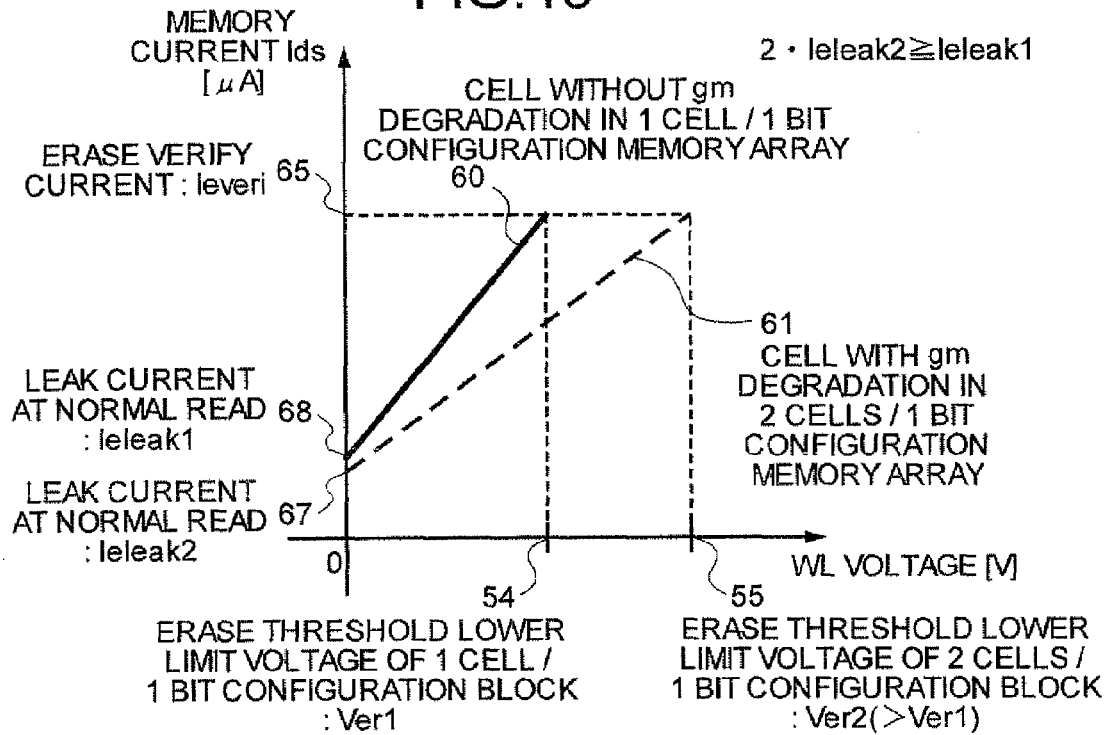

90~93···MAIN BIT LINES SHARED BY READ MEMORY CELL AND REFERENCE MEMORY CELL

SEMICONDUCTOR FLASH MEMORY

This application is a divisional of application Ser. No. 10/930,873, Sep. 1, 2004, now U.S. Pat. No. 7,251,165

BACKGROUND OF THE INVENTION

1) Field of the Invention

The present invention relates to a semiconductor flash memory.

2) Description of the Related Art

In general, when an erase/write operation is repeated frequently in a semiconductor flash memory, application of high voltage for the erase/write operation causes a stress, which degrades transconductance characteristic, gm, of a memory cell. As a result, ON current of the memory cell decreases, and OFF current increases. This phenomenon is referred to as "gm degradation", which will cause harmful effects on the semiconductor flash memory, such as "a decrease of read speed accompanied with the decrease of the ON current of the memory cell", and "a decrease of read margin accompanied with the increase of the OFF leak current of unselected memory cells".

As the ON current decreases, read speed decreases because low ON current of the memory cell is input to a sense amplifier. As the OFF leak current increases, difference between the ON current and the OFF leak current becomes smaller, which makes it difficult to judge "0" or "1" of read data, causing a decrease of the read margin.

A technology is disclosed in, for example, Japanese Patent Application Laid-Open Publication No. 2001-43691, to cope with the problem of gm degradation. In this technology, identical data is written into two memory cells or more, and at read process, true data is obtained by logical addition or majority judgment. In Japanese Patent Application Laid-Open Publication No. 1999-96782, another technology is disclosed in which identical data is written into two memory cells or more, and data is read simultaneously. However, because it is supposed that adjustment of verify threshold value is performed collectively for two memory cells or more, there is a possibility that a difference of the threshold value occurs between memory cells into which data is written.

However, in the conventional technology, one bit data is read by sensing the ON current of one memory cell at a read process of the semiconductor flash memory. Accordingly, when the gm degradation occurs, the read speed decreases. On the other hand, from a user side, there is a demand for an increased number of rewrite guarantee times for complicated applications.

Furthermore, the array of a reference memory cell that generates reference current to judge whether the selected read cell is in a write status or in an erase status is formed on a small block separate from the array of the read cell, and the distance from the sense amplifier to the read cell differs from that of the reference memory cell. As a result, loads of bit lines are different with each other, making the above structure unsuitable for high speed read by the sense amplifier of a differential amplification circuit.

Furthermore, when a write process is performed initially, data is held thereafter in the array of the reference memory cell of a separate block. Therefore, even if the erase/write operation is performed for many times, degradation of the transconductance gm will not occur. In other words, in repetitions of the erase/write operation, differences in characteristics occur between the read cell and the reference memory cell, and threshold voltage difference that should be constant will change, accordingly. From this point of view, the above structure is not suitable for high-speed read of the semiconductor flash memory.

Through repetitions of the read operation or by holding data for a long time, characteristics of both the read cell and the reference memory cell will change just after a write or an erase operation. There will be a cell whose threshold value is higher than read verify voltage, a cell whose threshold value is higher than erase verify voltage, and a cell whose threshold value is higher or lower than the threshold value set in the reference memory cell. The threshold value voltage difference between initially set read cell and reference memory cell will change, and the structure becomes unsuitable for high-speed read.

Furthermore, in the technology specified in FIG. 4 of Japanese Patent Application Laid-Open Publication No. 1999-96782, it is necessary to arrange one word line driver to each word line, therefore, in the advanced ultra fine configuration of memory cells at present, it is almost impossible to contain a word line decoder into the pitch of the word line.

SUMMARY OF THE INVENTION

It is an object of the present invention to solve at least the above problems in the conventional technology.

The semiconductor flash memory according to one aspect of the present invention includes an erase/write control unit that, when performing an erase/write operation of a plurality of read memory cells, reads and senses memory current of the read memory cells for each memory cell, and adjusts a threshold voltage of each of the read memory cells to a predetermined value; and a readout control unit that, when performing a read operation, selects two read memory cells or more simultaneously from among the read memory cells to which the erase/write control unit stored same data, and senses a total memory current for the two read memory cells or more.

The semiconductor flash memory according to another aspect of the present invention includes a first readout control unit that, when performing an erase/write operation of a plurality of read memory cells, selects two read memory cells or more simultaneously and senses a total memory current for every two read memory cells or more; a second readout control unit that selects only one read memory cell, and senses memory current of the only one read memory cell; and an erase/write control unit that, when performing an erase/write operation of the read memory cells, reads and senses the memory current of the read memory cells for each of the memory cells, and adjust a threshold voltage of each of the read memory cells to a predetermined value. Verify voltages for a first memory block formed by the two read memory cells or more selects simultaneously by the first readout control unit and a second memory block formed by the read memory cell selected one by one by the second readout control unit are set to different values. The first memory block stores same data.

The semiconductor flash memory according to still another aspect of the present invention includes a reference memory cell that is referred to by a sense amplifier to judge a logical value corresponding to memory current of a read memory cell; and a reference setting unit that is arranged in same memory cell array as an array of the read memory cell in such a manner that an array of the reference memory cell shares a bit line by that connects the reference memory cell to the sense amplifier and a bit line that connects the read memory cell to the sense amplifier, and sets a threshold value of each of the reference memory cells to a value between erase threshold upper limit value and write threshold lower limit value of the read memory cell in the array of the reference memory cell.

The semiconductor flash memory according to still another aspect of the present invention includes a reference memory cell that is referred to by a sense amplifier to judge a logical value corresponding to memory current of a read memory cell; and a reference setting unit that is arranged in same well as an array of the read memory cell in such a manner that an array of the reference memory cell connects the reference memory cell to the sense amplifier using a bit line different from a bit line that connects the read memory cell to the sense amplifier, and sets a threshold value of each of the reference memory cells to a value between erase threshold upper limit value and write threshold lower limit value of the read memory cell in the array of the reference memory cell.

The semiconductor flash memory according to still another aspect of the present invention includes a first block or more that holds one bit of information in a single memory cell driven by only one word line that is selected when a data read operation is performed; and a plurality of second blocks that hold one bit of information in a plurality of memory cells driven by a plurality of word lines that are selected simultaneously when a data read operation is performed. The second blocks are arranged adjacent to each other, and configured in such a manner that each of the second blocks applies a common predecode signal to a power source side terminal of a word line driver to perform an operation for selecting a word line.

The semiconductor flash memory according to still another aspect of the present invention includes a first block or more that holds one bit of information in a single memory cell driven by only one word line that is selected when a data read operation is performed; and a plurality of second blocks that hold one bit of information in a memory cell or more driven by a word line or more, the word line or more selected simultaneously one word line less when other operation than a normal data read operation is performed. The second blocks are arranged adjacent to each other, and configured in such a manner that each of the second blocks applies a common predecode signal to a power source side terminal of a word line driver to perform an operation for selecting a word line.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a schematic for explaining general read operation of a semiconductor flash memory;

FIG. 7 is a graph of cell current characteristics in the case of writing and verifying two memory cells simultaneously;

FIG. 8 is a graph of cell current characteristics in the case of writing and verifying one memory cell individually;

FIG. 9 is a graph of cell current characteristics in the case of erasing and verifying two memory cells simultaneously;

FIG. 10 is a graph of cell current characteristics in the case of erasing and verifying one memory cell individually;

FIG. 11 is a circuit diagram of a read circuit for explaining a method of selecting and sensing two memory cells simultaneously in a semiconductor flash memory according to a second embodiment of the present invention;

FIG. 13 is a graph for illustrating a write/erase verify voltage setting example in "1 cell/1 bit configuration block" and "2 cells/1 bit configuration block" with respectively different write/erase verify voltage and the memory threshold distribution at write/erase operations in a semiconductor flash memory according to a fourth embodiment of the present invention;

FIG. 14 is a graph for illustrating a comparison of "current characteristic of a cell without gm degradation in 1 cell/1 bit configuration memory array" and "current characteristic of a cell with gm degradation in 2 cells/1 bit configuration memory array" with respectively different erase verify voltage;

FIG. 15 is a figure showing an enlarged view around the erase verify voltage of the current characteristics shown in FIG. 14;

DETAILED DESCRIPTION

Exemplary embodiments of a semiconductor flash memory according to the present invention are explained in detail with reference to the accompanying drawings.

Figure 1:
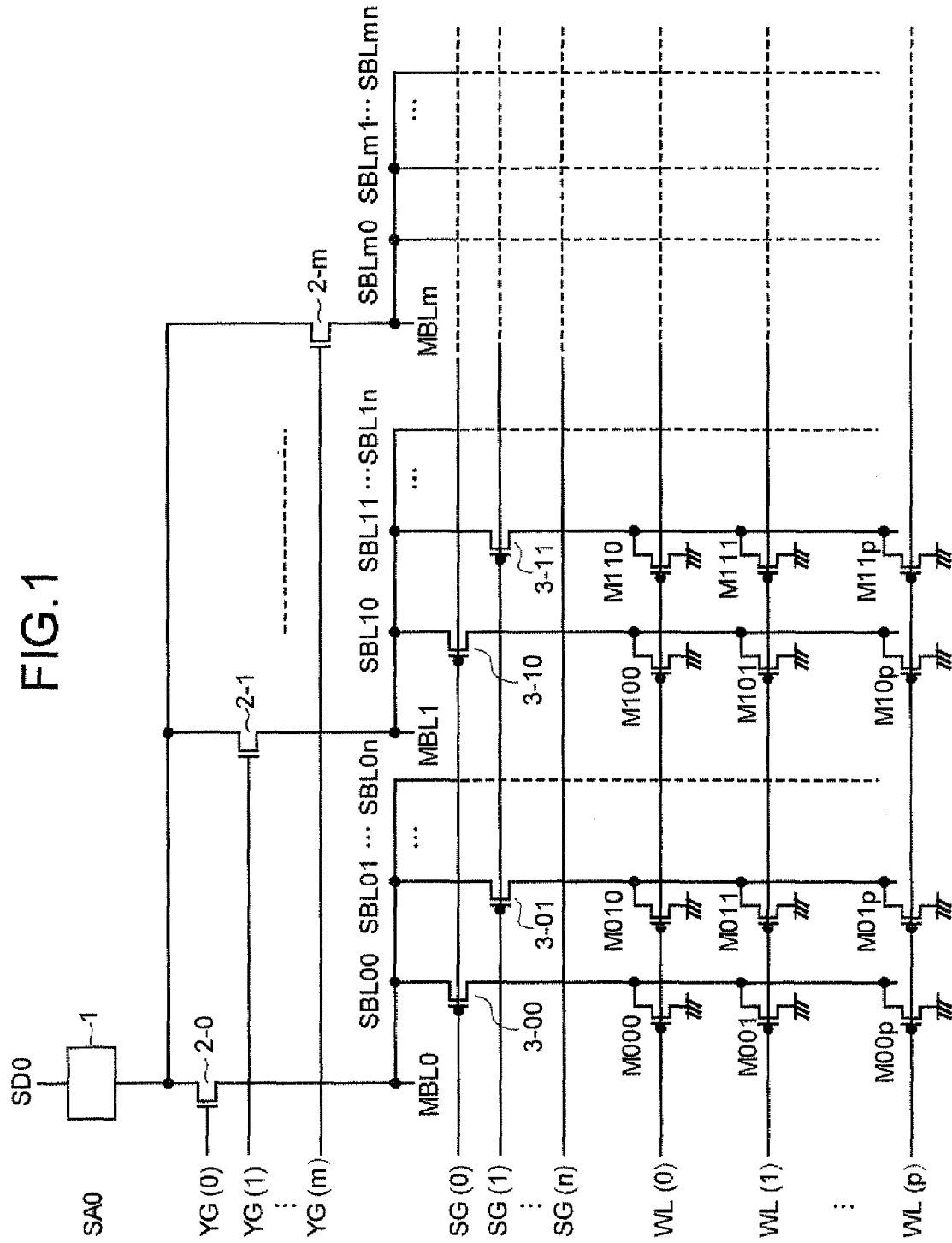
FIG. 1 is a circuit diagram of a read circuit of a semiconductor flash memory according to a first embodiment of the present invention.

FIG. 1 is a circuit diagram of a read circuit of a semiconductor flash memory according to a first embodiment of the present invention. Plural main bit lines MBL (MIBL0, MBL1, . . . , MBLm) are arranged in parallel at the input end of a sense amplifier (SA0) 1 that outputs sense data SD0. Between the SA0 and the main bit lines MBL0, MBL1, . . . , and MBLm, select transistors 2-0, 2-1, . . . and 2-m are inserted respectively. To gate electrodes of the select transistors 2-0, 2-1, . . . , and 2-m, Y gate lines YG (YG (0), YG (1), . . . , YG (m)) are connected respectively.

To each of the plural main bit lines MBL, plural sub bit lines SBL are arranged in parallel, and a select transistor is inserted between the MBL and SBL. To each gate electrode of the respective select transistors, a select gate line SG is connected.

The sub bit lines SBL00, SBL01, . . . , and SBL0n are arranged in parallel at the main bit line MBL0. Plural sub bit lines SBL10, SBL11, . . . , and SBL1n are arranged in parallel at the main bit line MBL1. Further, into the sub bit line SBL00, a select transistor 3-00 is inserted, and into the sub bit line SBL01, a select transistor 3-01 is inserted, and to the sub bit line SBL10, a select transistor 3-10 is inserted, and to the sub bit line SBL11, a select transistor 3-11 is inserted respectively.

In addition, to the gate electrodes of the select transistors 3-00, 3-10, . . . that are inserted into the sub bit lines SBL00, SBL10, . . . of the 0-th row, a select gate line SG (0) is connected. To the gate electrodes of the select transistors 3-01, 3-11, . . . that are inserted into the sub bit lines SBL01, SBL11, . . . of the first row, a select gate line SG (1) is connected. Thereafter, in the same manner, to the gate electrodes of the select transistors that are inserted into the sub bit lines SBL0n, SBL1n, . . . of the n-th row, a select gate line SG (n) is connected.

While, to each of the sub bit lines SBL, plural memory cells M are arranged in parallel via the above select transistors. In concrete, to the sub bit line SBL00, the memory cells M000, M001, . . . , and M00p are arranged in parallel via a select transistor 3-00. To the sub bit line SBL01, the memory cells M010, M011, . . . , and 01p are arranged in parallel via a select transistor 3-01. To the sub bit line SBL10, the memory cells M100, M101, . . . , and M10p are arranged in parallel via a select transistor 3-10. To the sub bit line SBL11, the memory cells M110, M111, . . . , and M11p are arranged in parallel via a select transistor 3-11.

Further, to control gate electrodes of the memory cells arranged in a row in horizontal direction, word lines WL (WL (0), WL (1), . . . , WL (p)) are connected. In concrete, to the control gate electrodes of the memory cells M000, M010, . . . , M100, M110, . . . , the word line WL (0) is connected. To the control gate electrodes of the memory cells M001, M011, . . . , M101, M111, . . . , the word line WL (1) is connected. Thereafter, in the same manner, to the control gate electrodes of the memory cells M00p, M01p, . . . , M10p, M11p, . . . , the word line WL (p) is connected.

The potential of the source electrode of each memory cell is so controlled as to become ground potential at read actions.

Therefore, in the present specification, for convenience of explanations, as shown in FIG. 1, the description that the source electrode of each memory cell is connected to the ground (i.e., grounded) shall specify that the circuit shows that at read actions. At memory data read, generally, only one line of the Y gate lines YG and one of the select gate lines SG and one of the word lines WL are made active ("H" level) respectively, thereby a desired memory cell M and the sense amplifier (SA0) 1 are connected with each other.

FIG. 2 is a schematic, diagram for explaining general read operation of a semiconductor flash memory. The conditions of the memory cell M in erase status ("H") and write status ("L"), the current characteristics (I-V characteristics) of the memory cell M, and the read actions of the memory cell M are shown.

As shown in FIG. 2, in the memory cell M in the erase status ("H"), because the electric charge accumulated in a floating gate 6 is extremely small, channel current (memory cell current) from drain to source starts flowing before the voltage of the word line WL (WL voltage) that is applied to a control gate electrode 5 reaches normal read voltage, and when the WL voltage reaches normal read voltage, a large amount of memory cell current flows. On the other hand, in the memory cell M in the write status ("L"), because the electric charge accumulated in the floating gate 6 is large, the memory cell current does not flow even when the WL voltage reaches normal read voltage, and starts flowing when the WL voltage exceeds normal read voltage sufficiently.

In this manner, memory data read is performed by use of the fact that the current value that is drawn out from the sense amplifier (SA0) 1 differs according to the electric charge accumulated in the floating gate 6 of the memory cell M selected to a certain WL voltage value. At this moment, the WL voltage value at which the judgment output value of the sense amplifier (SA0) 1 changes in each memory cell M becomes the memory threshold voltage. The reference current value of the sense amplifier (SA0) 1 is supplied from a separately arranged reference memory cell (Refer to FIG. 18.).

Figure 3:
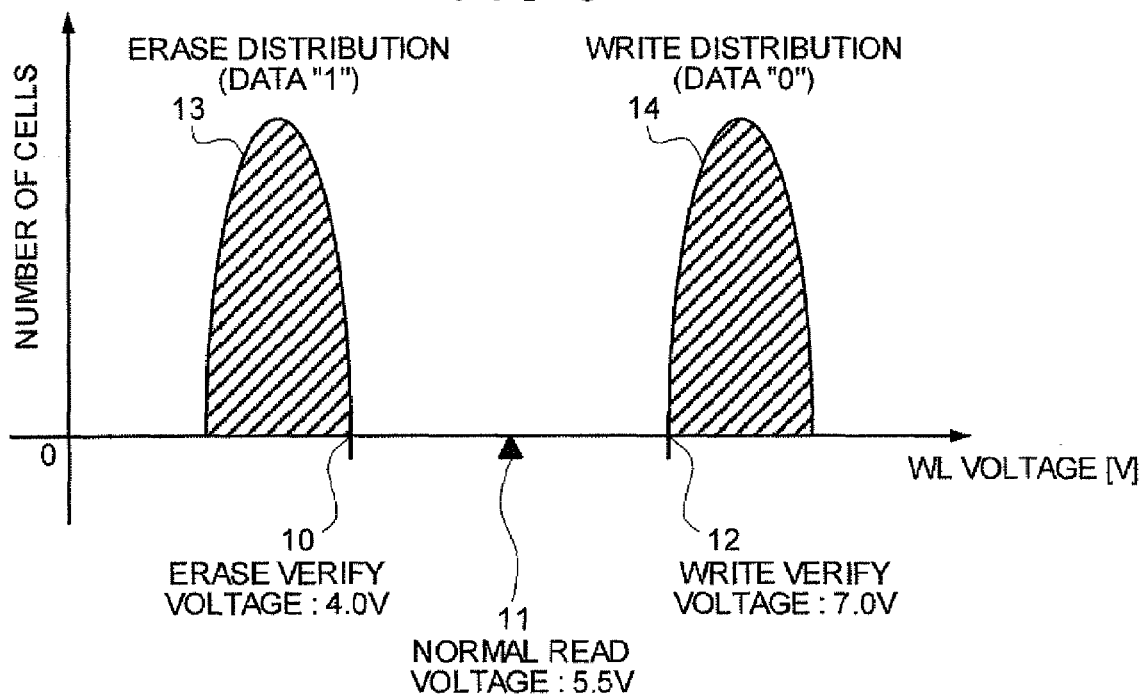
FIG. 3 is a graph for explaining threshold distributions of an erase status and a write status of a semiconductor flash memory.

FIG. 3 is a graph for explaining threshold voltage distributions of an erase status and a write status of a semiconductor flash memory. The horizontal axis represents word line signal voltage (WL voltage), and erase verify voltage 10 and normal read voltage 11 and write verify voltage 12 are shown in the relation that (erase verify voltage 10)<(normal read voltage 11)<(write verify voltage 12) The vertical axis represents the number of the memory cells.

In general, in a semiconductor flash memory, "erase operation" is carried out in whole erase block, and "write operation" is carried out in unit of plural bits such as 1 byte (~8 bits). In FIG. 3, a case is shown in which the memory threshold voltage in an erase distribution 13 of a logic value "1" distributes in low voltage side below normal read voltage 11 (for example, 5.5V), and the memory threshold voltage in a write distribution 14 of a logic value "0" distributes in high voltage side above the normal read voltage 11. In addition, as the erase verify voltage 10 as the upper limit judgment value of the memory threshold value in the erase distribution 13, for example, 4.0V is shown, while as the write verify voltage 12 as the lower limit threshold voltage in the write distribution 14, for example, 7.0V is shown.

In the erase sequence, an action in which erase pulse is applied and erase verify is carried out repeatedly, and the memory threshold voltage is decreased gradually, and when the threshold voltage of all the memory cells in one block goes below the erase verify voltage 10, erase pulse application is completed. While, in the write sequence, an action in which write pulse is applied and write verify is carried out repeatedly, and the memory threshold voltage is increased gradually, and when the threshold voltage of the memory cell concerned goes above the write verify voltage 12, write pulse application is completed. Hereinafter, so as to distinguish from "verify read" that is carried out at execution of this "erase/write" sequence, normal memory data read is referred to as "normal read".

In general, the more the current drawn from memory cells becomes, the sense amplifier (SA0) 1 can determine the state of the memory cells faster, and higher speed read operation is expected. Accordingly, even when individual memory cell suffers gm degradation owing to many times of erase/write operations, if sense current for 2 or more memory cells is obtained at "normal read", it is possible to avoid the degradation of read speed. However, in the verify operation, if two or more memory cells selected simultaneously as same as normal read are adjusted, sufficient effect may not be attained, as mentioned later.

In this first embodiment, in the erase/write sequence, verify read is carried out for each one memory cell and threshold voltage is adjusted individually and erase/write pulse application is carried out until a predetermined memory threshold voltage is attained. While, in "normal read", for example, by the method shown in FIG. 4, two memory cells are selected simultaneously and sensed (read method 1).

Figure 4:
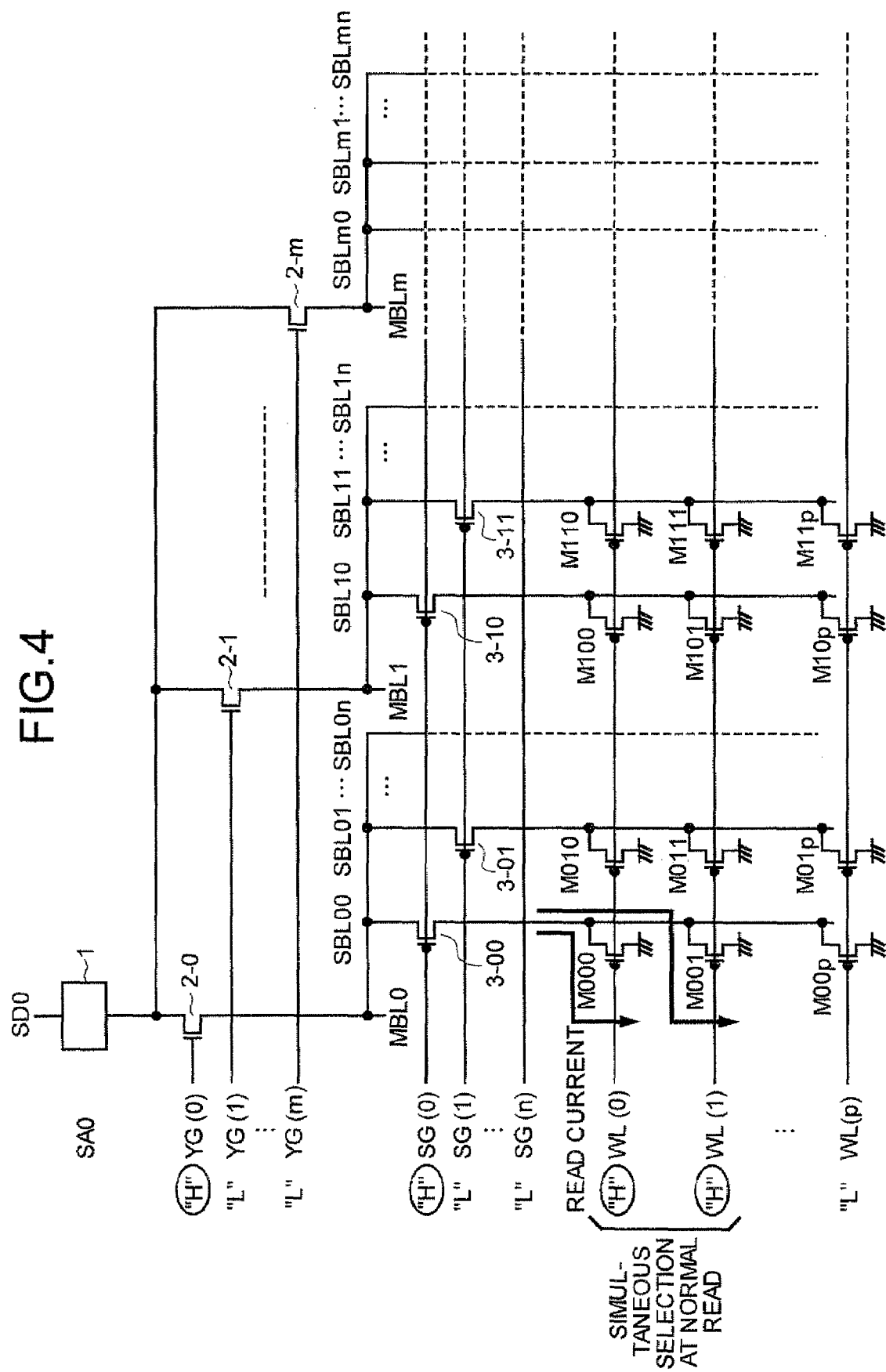
FIG. 4 is a circuit diagram of the read circuit according to the first embodiment for explaining a method of selecting and sensing two memory cells simultaneously.

FIG. 4 is a circuit diagram of the read circuit according to the first embodiment for explaining a method of selecting and sensing two memory cells simultaneously. Herein, explanations are made with erase cell read as an example. Suppose that memory cells M000 and M001 are memory cells that have been individually erased to erase verify voltage (4.0V) 10 in the above erase sequence. At normal read, an identical address is given to word lines WL (0) and WL (1) and these word lines are set into "H" level simultaneously, and the Y gate line YG (0) and the select gate SG line (0) are set both to "H" level. Then, from the sense amplifier (SA0) 1, memory current of two memory cells M000 and M001 is drawn out simultaneously. Accordingly it becomes possible to compensate for each memory cell current decrease owing to gm degradation. In a similar method, three memory cells or more may be selected simultaneously.

Figure 5:
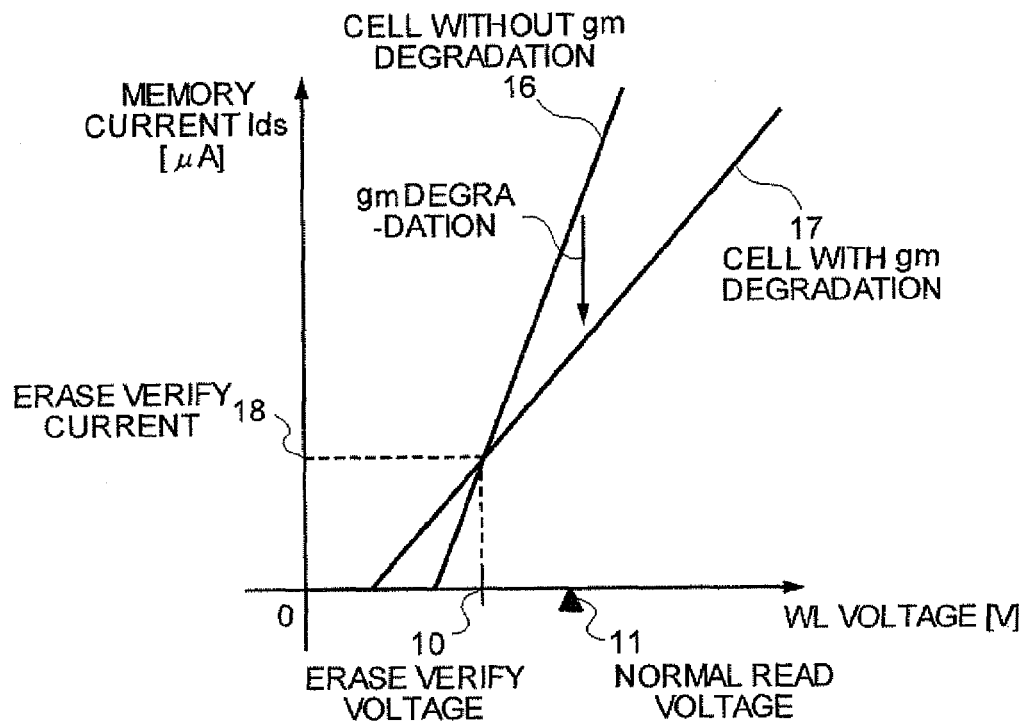
FIG. 5 is a graph of current characteristics of cells with and without gm degradation comparing memory cells erased by same erase verify voltage.

FIG. 5 is a graph showing a comparison between current characteristics of cells with and without gm degradation both verified by same erase verify voltage. The horizontal axis represents the gate-source voltage of memory cell (Vgs), i.e., WL voltage. In the horizontal axis, erase verify voltage 10, and normal read voltage 11 that is higher than the erase verify voltage 10 are shown. The vertical axis represents memory cell drain-source current (memory current) Ids. Current characteristic 16 of a memory cell without gm degradation and current characteristic 17 of a memory cell with gm degradation cross with each other at an equal erase verify current 18 under same verify voltage 10. And the current characteristic 16 of a memory cell without gm degradation rises at a relatively sharp inclination from the position near the erase verify voltage 10, while the current characteristic 17 of a memory cell with gm degradation rises at relatively moderate inclination from the position far away in lower voltage side than the erase verify voltage 10.

The method to read two cells simultaneously according to this embodiment is referred to as "2 cells/1 bit configuration" hereinafter, while the method to read only one cell is referred to as "1 cell/1 bit configuration". The significance of this embodiment is explained hereinafter in comparison of the above "2 cells/1 bit configuration" and "1 cell/1 bit configuration".

Figure 6:
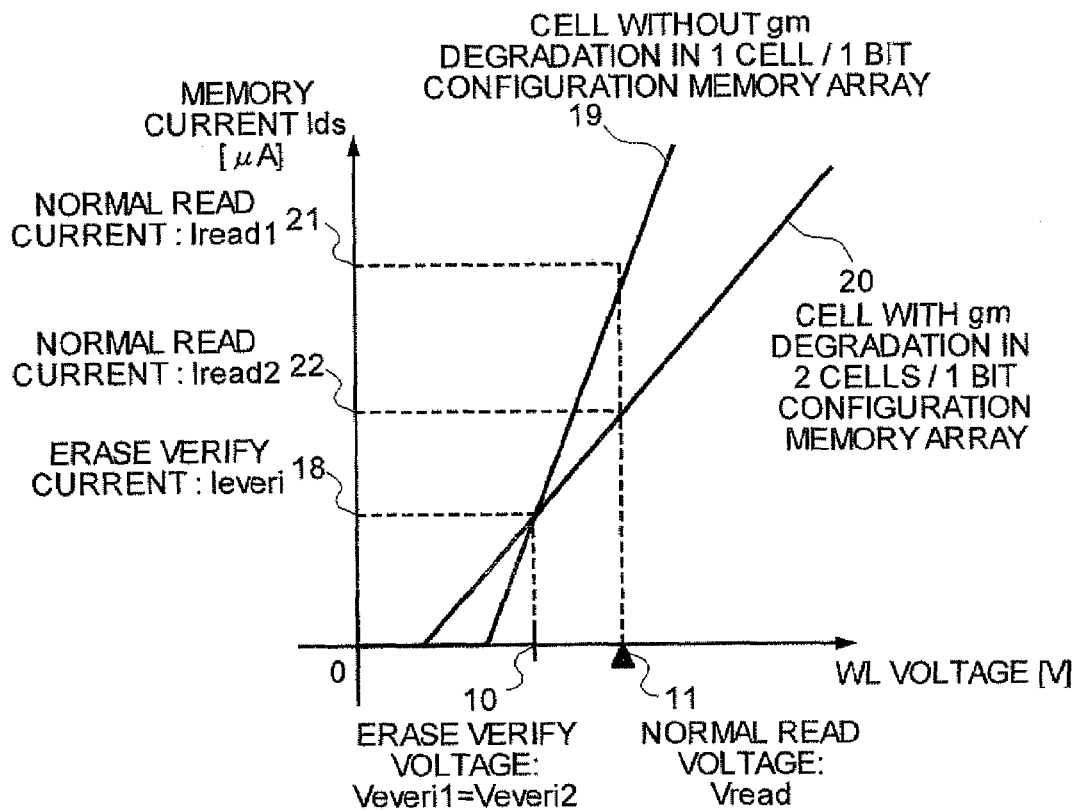
FIG. 6 is a graph for illustrating a comparison of general current characteristic of a cell without gm degradation in 1 cell/1 bit configuration memory array after erase operation and current characteristic of a cell with gm degradation in 2 cells/1 bit configuration memory array according to the first embodiment.

FIG. 6 is a graph showing a comparison of general current characteristic of a cell without gm degradation in 1 cell/1 bit configuration memory array after erase operation and current characteristic of a cell with gm degradation in 2 cells/1 bit configuration memory array according to the first embodiment. When the value of the erase verify voltage 10 in the memory block of 1 cell/1 bit configuration is defined as Veveri1, and the value of the erase verify voltage 10 in the memory block of 2 cells/1 bit configuration is defined as Veveri2, as shown in FIG. 6, current characteristic of a cell without gm degradation in 1 cell/1 bit configuration memory array 19 and current characteristic of a cell with gm degradation in 2 cells/1 bit configuration memory array 20 in the case in which the erase verify voltage 10 of the above two is set equal (Veveri1=Veveri2) are shown. The current characteristic of a cell without gm degradation in 1 cell/1 bit configuration memory array 19 and the current characteristic of a cell with gm degradation in 2 cells/1 bit configuration memory array 20 cross with each other at an equal erase verify current (value Ieveri) 18 when the value of the erase verify voltage 10 is Veveri1=Veveri2.

At normal read, when a value Vread as the normal read voltage 11 is applied to the word lines WL, the normal read current 21 in the memory array 19 of 1 cell/1 bit configuration is a value Iread1, while the normal read current 22 in the memory array 20 of 2 cells/1 bit configuration is a value Iread2 smaller than Iread1 for one cell.

Accordingly, in the method according to this first embodiment in which two memory cells are selected simultaneously at read of one bit data, and the total memory current of these two memory cells is sensed, in the range of gm degradation degree of the range in which the current value relation that (2·Iread2)>(Iread1) can be maintained, even if each memory cell suffer gm degradation owing to many times of erase/write sequence. By carrying out 2 cells/1 bit read, the memory cell without gm degradation can be read at a speed equivalent to the case of 1 cell/1 bit read. In addition, from this fact, it is understood that, in the block of 2 cells/1 bit configuration, ease/write cycle five restriction is looser than in the block of 1 cell/1 bit configuration. Explanations have been so far made on erase cell, while it is needless to say that explanations are same write cell.

Next, in order to attain the above effect according to this first embodiment, it is important that, in the execution of erase/write sequences, verify read should be carried out for each one memory cell and threshold voltage should be adjusted individually until a predetermined memory threshold voltage is attained. In concrete, at the execution of erase/write sequences, if verify read is carried out for two memory cells collectively at one time, and threshold voltage is adjusted by the total cell current of two memory cells, threshold voltage in each memory cell may become uneven, and the above effect may not be obtained sufficiently.

FIG. 7 is a graph of cell current characteristics in the case of writing and verifying two memory cells simultaneously. FIG. 8 is a graph of cell current characteristics in the case of writing and verifying memory cells individually. In the horizontal axis (WL voltage), normal read voltage 11 and write verify voltage 25 are shown. In the vertical axis (memory current Ids), in FIG. 7, normal read current 26 and write verify current 27 are shown, and in FIG. 8, normal read current 28 and write verify current 29 are shown.

When to write and verify two memory cells simultaneously, as shown in the current characteristic of the cell (1) and that of the cell (2) in FIG. 7, threshold voltage that specifies the current characteristic of each memory cell may be different, and verify may pass with such unevenness. The threshold voltage of the current characteristic of the cell (1) is at a lower voltage side than the normal read voltage 11, while the threshold voltage of the current characteristic of the cell (2) is at a higher voltage side than the normal read voltage 11. Consequently, the composite current characteristic (cell (1)+ cell (2)) will bend on the way and go upward therefrom.

With regard to write verify, a value Vwveri as write verify voltage 25 is applied to the word lines WL, and is verified at a cross point (write verify point) 30 with a current value Iwveri0 for two memory cells as write verify current 27. Then, when two memory cells showing the composite current characteristic (cell (1)+cell (2)) are read simultaneously at normal read, in the value Vread of the normal read voltage 11, leak current of the value Iread0 corresponding to the memory current of the cell (1) as the normal read current 26 may flow.

On the other hand, in FIG. 8, when to write and verify one memory cell individually, the threshold voltage that specifies the current characteristic of each memory cell, as shown in the current characteristic of the cell (1) and that of the cell (2), becomes almost same and their threshold voltage values are both higher than normal read voltage 11. Therefore, the current characteristic of the cell (1) and that of the cell (2) are added with almost same threshold voltage as starting point, the composite current characteristic (cell (1)+cell (2)) will go upward linearly with a certain inclination. With regard to write verify, a value Vwveri as write verify voltage 25 is applied to the word lines WL, and is verified at a cross point (write verify point) 31 with a current value Iwveri0/2 for one memory cell as write verify current 29. When two memory cells are read simultaneously at normal read, in the value Vread of the normal read voltage 11, the normal read current 28 is nearly zero.

When to write and verify two memory cells simultaneously, judgment of "0" or "1" by the sense amplifier becomes difficult, since there is leak current, compared to the case to write and verify one memory cell individually without leak current, and DC and AC margin at normal read both decrease.

FIG. 9 is a graph of cell current characteristics in the case of erasing and verifying two memory cells simultaneously. FIG. 10 is a graph of cell current characteristics in the case of erasing and verifying memory cells individually. In the horizontal axis (WL voltage), erase verify voltage 35 and normal read voltage 11 are shown. In the vertical axis (memory current Ids), in FIG. 9, erase verify current 36 and normal read current 37 are shown, while in FIG. 10, erase verify current 38 and normal read current 39 are shown.

When to erase and verify two memory cells simultaneously, as shown in the current characteristic of the cell (1) and that of the cell (2), threshold voltage that specifies the current characteristic of each memory cell may be different, and verify may pass with such unevenness. The threshold voltage that specifies the current characteristic of the cell (1) is at a lower voltage side than the erase verify voltage 35 and the threshold voltage that specifies the current characteristic of the cell (2) is at a higher voltage side than the erase verify voltage 35 and at a position near the normal read voltage 11. Consequently, the composite current characteristic (cell (1)+ cell (2)) will bend on the way and go upward therefrom.

With regard to erase verify, a value Veveri as erase verify voltage 35 is applied to the word lines WL, and is verified at a cross point (erase verify point) 40 with a current value Ieveri0 for two memory cells as erase verify current 36. Then, when two memory cells showing the composite current characteristic (cell (1)+cell (2)) are read simultaneously at normal read, at the value Vread of the normal read voltage 11, current of the value Iread (a) slightly increased compared to the all current of cell (1) flows as the normal read current 37.

On the other hand, in FIG. 10, when to erase and verify memory cells individually, the threshold voltage that specifies the current characteristic of each memory cell, as shown in the current characteristic of the cell (1) and that of the cell (2), becomes almost same at the position near the erase verify voltage 35 respectively, therefore, the current characteristics of the cell (1) and the cell (2) are added with almost same threshold voltage as starting point. Consequently the composite current characteristic (cell (1)+cell (2)) will go upward linearly with a certain inclination. With regard to erase verify, a value Veveri as erase verify voltage 35 is applied to the word lines WL, and is verified at a cross point (erase verify point) 41 with a current value Ieveri0/2 for one memory cell as erase verify current 38. In this case, when two memory cells are read simultaneously at normal read, at the value Vread of the normal read voltage 11, current of a value Iread (b) flows as normal read current 39. Herein, it stands that Iread (b)>Iread (a).

In concrete, the normal read cell current in the case to erase and verify two memory cells simultaneously may become smaller than that in the case to erase and verify memory cells individually. Therefore, in the case to erase and verify two memory cells simultaneously, judgment of "0" or "1" by the sense amplifier becomes difficult, and DC & AC margin at normal read both decrease. On the contrary, in the case to erase and verify one memory cell after another, there is no margin decrease of normal read as in the case to erase and verify two memory cells simultaneously.

As mentioned above, according to the first embodiment, at the execution of erase/write sequences, verify read is carried out for each memory cell and threshold voltage is adjusted individually and erase/write operations are carried out until a desired memory threshold voltage is attained. And, in normal read, an identical address is given to two word or more lines and two or more memory cells are selected simultaneously, therefore, even if each memory cell suffers gm degradation owing to many times of erase/write sequences, it is possible to avoid the decrease of read speed. Further, it is possible to increase the number of rewrite guarantee times without causing the decrease of read speed.

Furthermore, a memory array of the same layout configuration as the memory block of "1 cell/1 bit configuration" can be used as the memory block of "plural cells/1 bit configuration". Accordingly, there is no need to develop a new memory array layout in the embodiment of the present invention. It is another advantage. In concrete, by simply adding to the read control circuit the function to divide a memory array into a memory block of "plural cells/1 bit configuration" and a memory block of "1 cell/1 bit configuration" and thereby controlling them, the present invention can be embodied. It is preferable to allot this memory block of "plural cells/1 bit configuration" for high reliability.

FIG. 11 is a circuit diagram of a read circuit for explaining a method of selecting and sensing two memory cells simultaneously in a semiconductor flash memory according to a second embodiment of the present invention. In this second embodiment, as the method (2) to select and sense two memory cells simultaneously, a method is shown in which at the execution of erase/write sequences, verify read is carried out for each one memory cell and the threshold voltage is adjusted individually and erase/write operations are carried out until a predetermined memory threshold voltage is attained. And, in normal read, for example as shown in FIG. 11, two select gate lines SG are selected simultaneously, and by two sub bit lines SBL connected to a same main bit line MBL, two memory cells connected to a same word line WL are selected simultaneously.

In concrete, in FIG. 11, suppose that memory cells M000 and M001 are memory cells that have been individually erased to erase verify voltage (refer to FIG. 3.) in the erase sequence explained in the first embodiment. At normal read, when to select these erase memory cells M000 and M001 simultaneously, the word line WL (0) is set to "H" level, and Y gate line YG (0) is set to "H" level and the select gate SG lines SG (0) and SG (1) are set to "H" level simultaneously.

According to the above settings, from the sense amplifier (SA0) 1, memory current of the two memory cells M000 and M 010 is drawn out simultaneously, therefore it is possible to compensate for each memory cell current decrease owing to gm degradation. In this second embodiment, too, in the same manner as in the first embodiment, three or more memory cells may be selected simultaneously. Therefore, it is possible to cope with larger gm degradation.

As mentioned above, according to the second embodiment, at the execution of erase/write sequences, verify read is carried out for each one memory cell and threshold voltage is adjusted individually and erase/write operations are carried out until a predetermined memory threshold voltage is attained. And, in "normal read", two or more select gate lines SG are selected simultaneously and two memory cells connected to a same word line WL are selected simultaneously. Therefore, in the same manner as in the first embodiment, even if each memory cell suffers gm degradation owing to many times of rewrite operations, it is possible to avoid the decrease of read speed. Further, it is possible to increase the number of rewrite guarantee times without causing the decrease of read speed.

Furthermore, in the same manner as in the first embodiment, by simply adding to the read control circuit the function to divide a memory array into a memory block of "plural cells/1 bit configuration" and a memory block of "1 cell/1 bit configuration" and thereby controlling them, the present invention can be embodied. It is preferable to allot this memory block of "plural cells/1 bit configuration" for high reliability.

Figure 12:
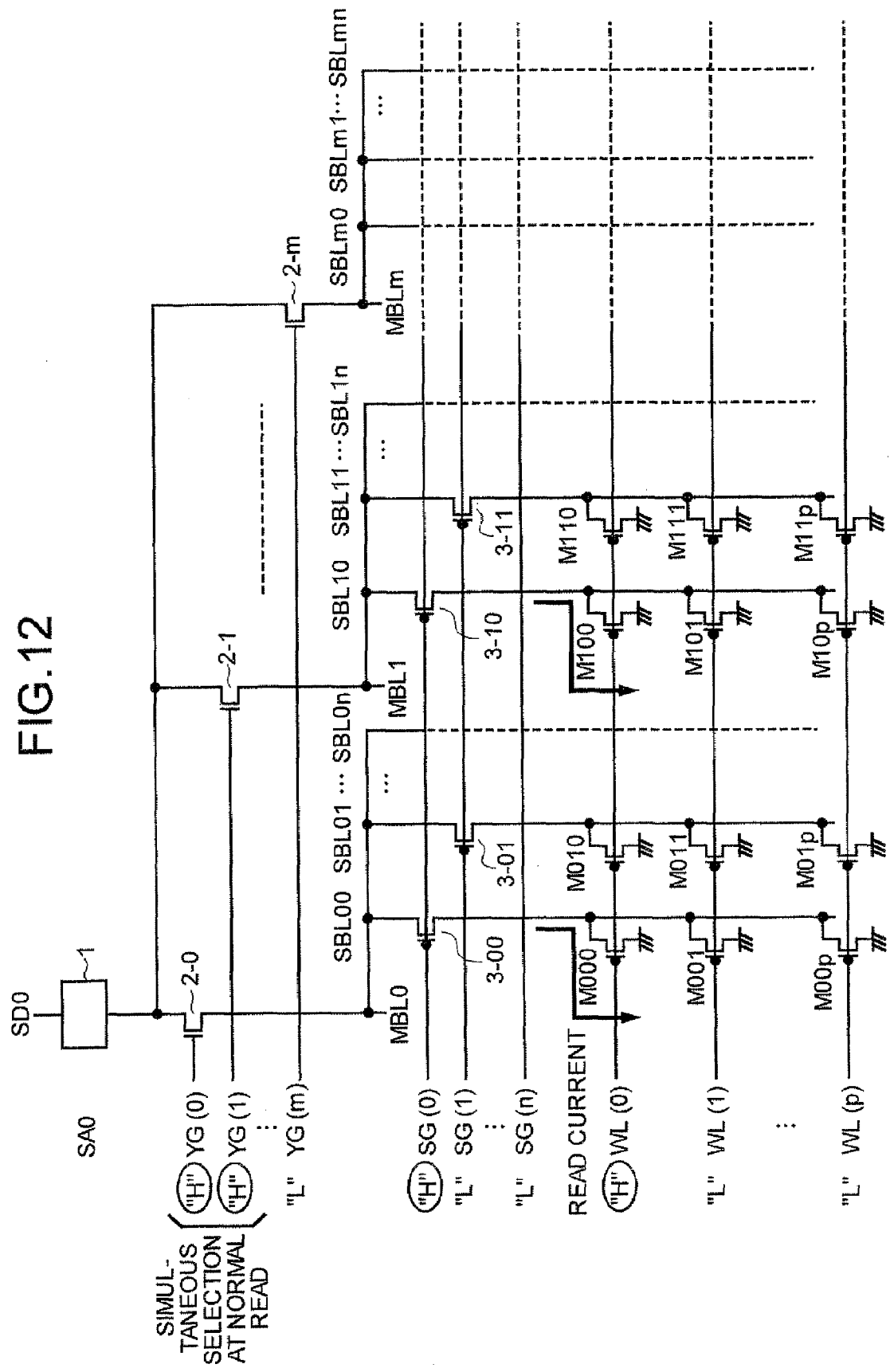
FIG. 12 is a circuit diagram of a read circuit for explaining a method of selecting and sensing two memory cells simultaneously in a semiconductor flash memory according to a third embodiment of the present invention.

FIG. 12 is a circuit diagram of a read circuit for explaining a method of selecting and sensing two memory cells simultaneously in a semiconductor flash memory according to a third embodiment of the present invention. In this third embodiment, as the method (3) to select and sense two memory cells simultaneously, a method is shown in which at the execution of erase/write sequences, verify read is carried out for each memory cell and the threshold voltage is adjusted individually and erase/write operations are carried out until a predetermined memory threshold voltage is attained. And, in normal read, for example as shown in FIG. 12, two Y gate lines YG are selected simultaneously, and two memory cells connected to a same word line WL are selected simultaneously by one corresponding sub bit line SBL connected to each of two main bit lines MBL.

In concrete, in FIG. 12, suppose that memory cells M000 and M001 are memory cells that have been individually erased to erase verify voltage (refer to FIG. 3.) in the erase sequence explained in the first embodiment. At normal read, when to select these erase memory cells M000 and M001 simultaneously, the word line WL (0) is set to "H" level, and the Y gate lines YG (0) and YG (1) are set to "H" level simultaneously, and the select gate SG line (0) is set to "H" level.

According to the above manner, from the sense amplifier (SA0) 1, memory current of two memory cells M000 and M 100 is drawn out simultaneously. Consequently, it is possible to compensate for each memory cell current decrease owing to gm degradation. In this third embodiment, too, in the same manner as in the first embodiment and the second embodiment, three or more memory cells can be selected simultaneously.

As mentioned above, according to the third embodiment, at the execution of erase/write sequences, verify read is carried out for each memory cell and threshold voltage is adjusted individually and erase/write operations are carried out until a predetermined memory threshold voltage is attained. And, in "normal read", two or more Y gate lines YG are selected simultaneously and two memory cells connected to same word line WL are selected simultaneously. Therefore, in the same manner as in the first embodiment and the second embodiment, even if each memory cell suffers gm degradation owing to many times of erase/write sequences, it is possible to avoid the decrease of read speed. Further, it is possible to increase the number of rewrite guarantee times.

Furthermore, in the same manner as in the first embodiment and the second embodiment, by simply adding to the read control circuit the function to divide a memory array into a memory block of "plural cells/1 bit configuration" and a memory block of "1 cell/1 bit configuration" and thereby controlling them, the present invention may be embodied. In addition, it is preferable to allot this memory block of "plural cells/1 bit configuration" for high reliability.

FIG. 13 is a graph for illustrating an example of write/erase verify voltage setting and the memory threshold distribution in "1 cell/1 bit configuration block" and "2 cells/1 bit configuration block" with mutually different write/erase verify voltage in a semiconductor flash memory according to a fourth embodiment of the present invention. In this fourth embodiment, a configuration example is shown in which verify voltage at the execution of erase/write verify operations are set different for "1 cell/1 bit configuration block" and "2 cells/1 bit configuration block".

The vertical axis represents the number of memory cells. In the horizontal axis (WL voltage), "1 cell/1 bit configuration block erase distribution (data "1")" 45 and "2 cells/1 bit configuration block erase distribution (data "1")" 46 are shown in the low voltage side of the normal read voltage 11, while "1 cell/1 bit configuration block write distribution (data "0")" 47 and "2 cells/1 bit configuration block write distribution (data "0")" 48 are shown in the higher voltage side thereof.

The value Vever1 of the erase verify voltage 50 of the "1 cell/1 bit configuration block erase distribution (data "1")" 45, and the value Vever2 of the erase verify voltage 51 of the "2 cells/1 bit configuration block erase distribution (data "1")" 46 are in the relation that Vever1<Vever2. While, the value Vwver1 of the write verify voltage 52 of the "1 cell/1 bit configuration block write distribution (data "0")" 47, and the value Vwver2 of the write verify voltage 53 of the "2 cells/1 bit configuration block write distribution (data "0")" 48 are in the relation that Vwver1<Vwver2.

In addition, the value of erase threshold lower limit voltage 54 of the "1 cell/1 bit configuration block erase distribution (data "1")" 45 is Ver1, and the value of erase threshold lower limit voltage 55 of the "2 cells/1 bit configuration block erase distribution (data "1")" 46 is Ver2 (Ver1<Ver2). Further, the potential difference ΔVe of the value Ver2 of the erase threshold lower limit voltage 55 and WL voltage=0 (WL voltage at non select) is shown, and the potential difference ΔVw of the value Vread of the normal read voltage 11 and the value Vwver2 of the write verify voltage 53 is shown.

FIG. 14 is a graph for illustrating a comparison between current characteristic of a cell without gm degradation in 1 cell/1 bit configuration memory array and "current characteristic of a cell with gm degradation in 2 cells/1 bit configuration memory array with different erase verify voltage.

In the horizontal axis (WL voltage), normal read voltage (value Vread) 11, erase verify voltage (value Veveri1) 50 to the current characteristic of a cell without gm degradation in 1 cell/1 bit configuration memory array 60, and erase verify voltage (value Veveri2) 51 to the current characteristic of a cell with gm degradation in 2 cells/1 bit configuration memory array 61 are shown. It stands that Veveri1<Veveri2<Vread. While, in the vertical axis (memory current (Ids)), normal read current (value Iread 1) 63 in the current characteristic of a cell without gm degradation in 1 cell/1 bit configuration memory array 60, and normal read current (value Iread2) 64 in the current characteristic of a cell with gm degradation in 2 cells/1 bit configuration memory array 61, and erase verify current (value Ieveri) 65 are shown.

Now, in erase verify, the erase verify voltage, that varies in the 1 cell/1 bit configuration memory array and the 2 cells/1 bit configuration memory array is so set that equal erase read current Iveri should be obtained in both the 1 cell/1 bit configuration memory array and the 2 cells/1 bit configuration memory array. While, in normal read, when the normal read voltage Vread 11 is applied to the word lines WL, the normal read current 63 in the 1 cell/1 bit configuration memory array is the value Iread1, while the normal read current 64 in the 2 cells/1 bit configuration memory array becomes the value Iread2 for each cell (Iread2<Iread1). Therefore, the composite cell current becomes 2·Iread2 for two cells.

Accordingly, even when only the memory cells in the 2 cells/1 bit configuration memory array suffer gm degradation owing to many times of rewrite operations, and the memory cell current of each memory cell decreases, the read current 2·Iread2 for 2 cells in the 2 cells/1 bit configuration memory array concerned can be made to be at the same level as that of the read current Iread1 in the 1 cell/1 bit configuration memory array without degradation. In other words, if it is set that Veveri2>Veveri1, and 2·Iread2≧Iread1, in the same manner as in the first through third embodiments, twice of memory current flows in the 2 cells/1 bit configuration memory array. The read operation of memory cells with gm degradation in the 2 cells/1 bit configuration memory array may be made at the speed equivalent to the read speed of memory cells without gm degradation.

Figure 16:
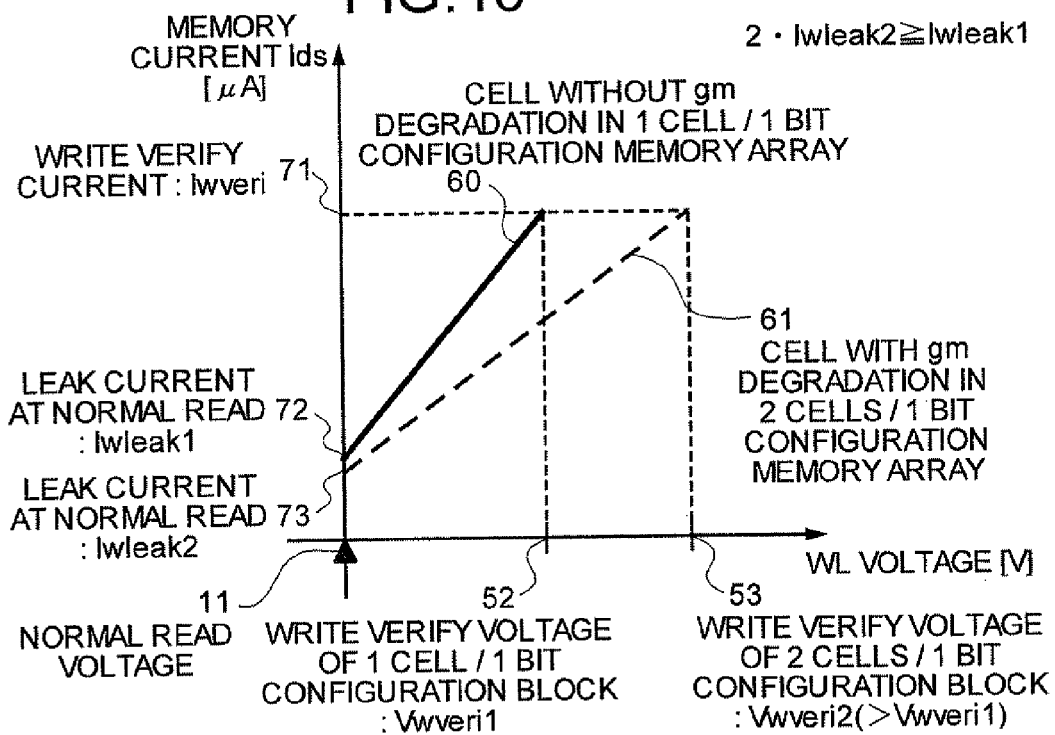
FIG. 16 is an enlarged view around the write verify voltage of current characteristic of a cell without gm degradation in 1 cell/1 bit configuration memory array and current characteristic of a cell with gm degradation in 2 cells/1 bit configuration memory array with respectively different write verify voltage.

FIG. 15 is a figure showing an enlarged view around the erase verify voltage of the current characteristics shown in FIG. 14. FIG. 16 is an enlarged view around the write verify voltage of current characteristic of a cell memory without gm degradation in 1 cell/1 bit configuration memory array and current characteristic of a cell memory with gm degradation in 2 cells/1 bit configuration memory array with mutually different write verify voltage.

In the horizontal axis (WL voltage), erase threshold lower limit voltage (value Ver1) 54 to the current characteristic of a cell without gm degradation in 1 cell/1 bit configuration memory array 60, and erase threshold lower limit voltage (value Ver2) 55 to the current characteristic of a cell memory with gm degradation in 2 cells/1 bit configuration memory array 61 are shown. It stands that Ver1<Ver2. While, in the vertical axis (memory current (Ids)), erase verify current (value Ieveri1) 65, normal read current (Ieleak1) 68, and normal read current (Ieleak2) 67 for unselected (ice. WL=OV) memory cell are shown.

As mentioned above, when the erase verify voltage (value Veveri1) 50 of the 1 cell/1 bit configuration memory block and the erase verify voltage (value Veveri2) 51 of the 2 cells/1 bit configuration memory block are so set that Veveri2>Veveri1, the erase threshold lower limit voltage of the 1 cell/1 bit configuration memory block (value Ver1) 54 and the erase threshold lower limit voltage of the 2 cells/1 bit configuration memory block (value Ver2) 55 become in the relation that Ver2>Ver1. Therefore, as shown in FIG. 15, leak current (value Ieleak1) 68 of unselected cells (WL voltage=0) at normal read in the 1 cell/1 bit configuration memory block, and leak current (value Ieleak2) 67 of unselected cells (WL voltage=0) at normal read for one cell in the 2 cells/1 bit configuration memory block become in the relation that Ieleak1>Ieleak2, and for 2 cells, Veveri2 and Veveri1 may be set so that Ieleak1≦2·Ieleak2. Thereby, it is possible to secure the read margin of write cell in the 2 cells/1 bit configuration memory block.

In FIG. 16, in the horizontal axis (WL voltage), write verify voltage (value Vweri1) 52 to the current characteristic of a cell without gm degradation in 1 cell/1 bit configuration memory array 60, and write verify voltage (value Vweri2) 53 to the current characteristic of a cell with gm degradation in 2 cells/1 bit configuration memory array 61 are shown. It stands that Vwveri1<Vwveri2. While, in the vertical axis (memory current (Ids)), write verify current (value Iwveri1) 71, normal read current (Iwleak1) 72, and normal read current (Iwleak2) 73 are shown.

As mentioned above, when the write verify voltage (value Vwveri1) 52 of the 1 cell/1 bit configuration memory block and the write verify voltage (value Vwveri2) 53 of the 2 cells/1 bit configuration memory block are so set that Vwveri2>Vwveri1, as shown in FIG. 16, the normal read current (self leak current at read voltage: value Iwleak1) 72 in the 1 cell/1 bit configuration memory block and the normal read current (self leak current at read voltage: value Iwleak2) in the 2 cells/1 bit configuration memory block 73 become in the relation that Iwleak1>Iwleak2. Therefore, even for 2 cells, Veveri2 and Veveri1 may be so set that 2·Iwleak2≦Iwleak1. Thereby, it is possible to secure the read margin of write cell in the 2 cells/1 bit configuration memory block.

In concrete, by making the verify voltage of the 1 cell/1 bit configuration memory block and the verify voltage of the 2 cells/1 bit configuration memory block different each other, it is possible to secure read margin for write memory cell in the 2 cells/1 bit configuration memory block, and to read memory cells with gm degradation at the speed equivalent to that for memory cells without gm degradation.

Further, it is known to those skilled in the art that gm degradation owing to erase/write stress is a phenomenon in which electrons collect in an insulation film near drain electrode of memory cell. It causes the increase of threshold voltage and the decrease of mobility. Another phenomenon is also known in which threshold voltage decreases by for example nearly 1V, the mobility is recovered when electrons near drain electrode get energy at high temperature and are discharged. Therefore, in this fourth embodiment, in FIG. 13, as the relation between the potential difference ΔVe between the value Ver2 of the erase threshold lower limit voltage 55 in the erase distribution 46 of 2 cells/1 bit configuration memory block and WL voltage=0 (at unselected status), and the potential difference ΔVw between the value Vread of the normal read voltage 11 and the value Vwveri2 of the write verify voltage 53 in the write distribution 48 of 2 cells/1 bit configuration memory block, it is set that ΔVw>ΔVe. Thereby, even if there is a decrease of threshold voltage owing to recovery of gm degradation, it is possible to secure read margin of write memory cell. Accordingly, it becomes possible to perform high speed read.

While, in both the case of gm degradation, and the case where degradation recovers by exposure for high temperature and threshold voltage goes down, the leak current of unselected memory cells and the leak current of selected memory cells can be made not to affect upon read. For example, when they can be controlled at 1 μA or below, it is set that ΔVw=ΔVe. Thereby, in the 2 cells/1 bit configuration memory block, it is possible to make write verify voltage lower than prior art. Accordingly, the high voltage generated by charge pump circuit becomes small. As a result, it is possible to reduce the chip area.

Figure 17:
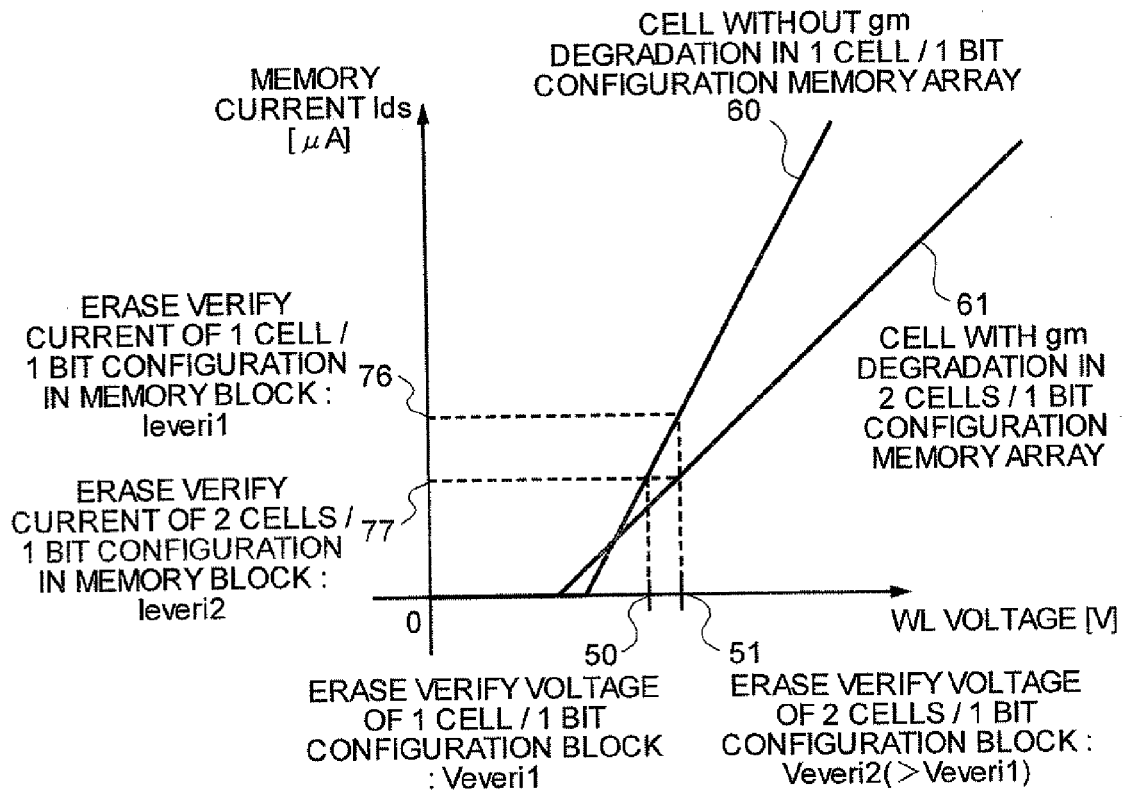
FIG. 17 is a graph for illustrating another method of controlling a threshold voltage of a memory cell.

In FIG. 14 to FIG. 16, the case to control the threshold voltage so as to obtain different verify voltage by an identical verify current has been shown as the control method of the threshold voltage in the 1 cell/1 bit configuration memory block and the 2 cells/1 bit configuration memory block. Now in reference to FIG. 17, another control method is explained hereinafter. FIG. 17 is a graph for illustrating another method of controlling a threshold voltage of a memory cell. According to this control method, similar effects as mentioned above are attained.

The current characteristic of a cell without gm degradation in 1 cell/1 bit configuration memory array 60 and the current characteristic of a cell with gm degradation in 2 cells/1 bit configuration memory array 61 at erase verify are shown in FIG. 17. Therein, a case is shown in which by the erase verify voltage (value Veveri2) 51 erase verify current (value Ieveri1) 76 of the 1 cell/1 bit configuration memory block, and erase verify current (value Ieveri2) 77 of the 2 cells/1 bit configuration memory block are obtained. In the same manner, erase verify current may be obtained based on erase verify voltage (value Veveri1) of the 1 cell/1 bit configuration block at the low voltage side.

Figure 18:
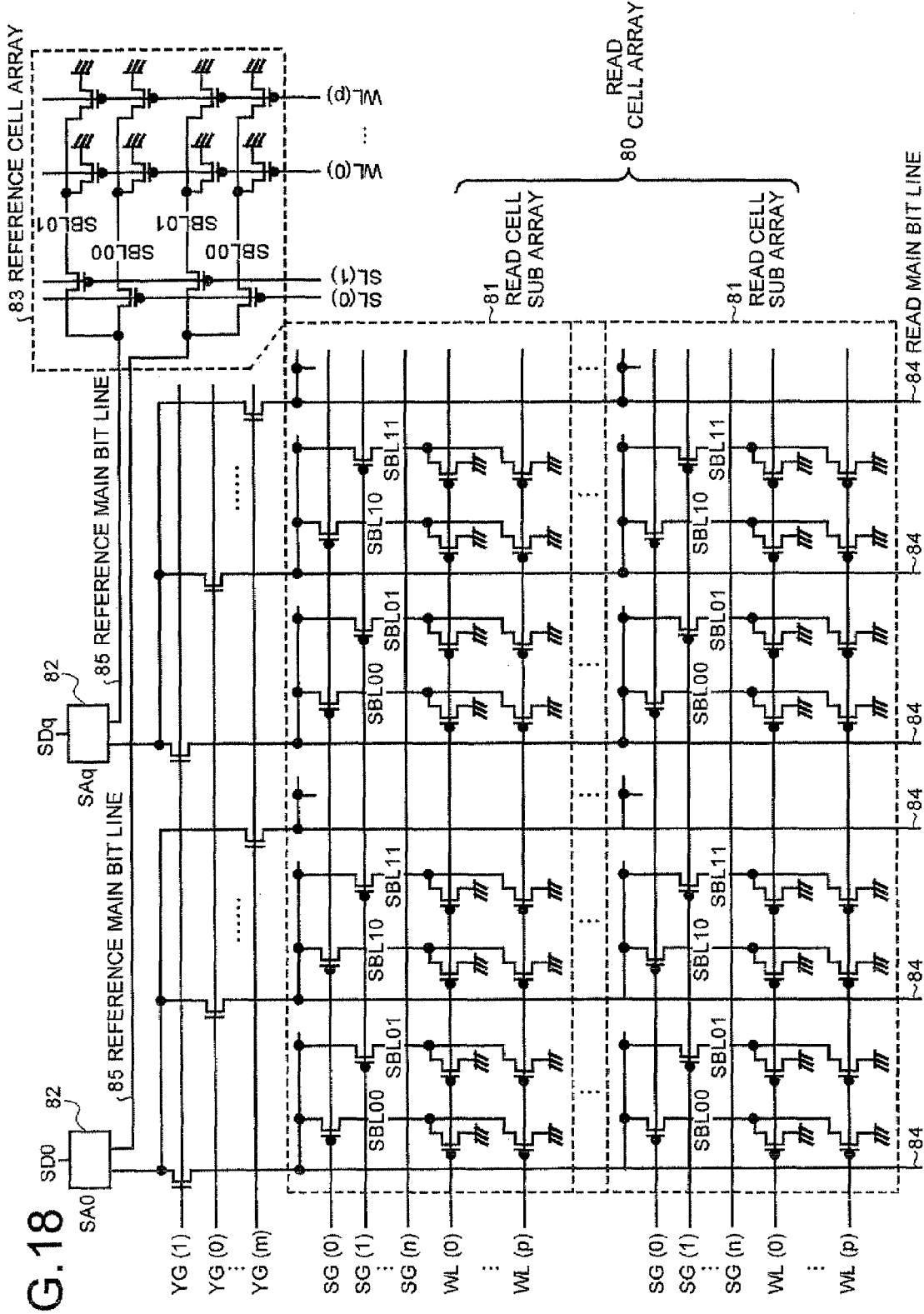
FIG. 18 is a schematic for illustrating a relation between a read memory cell, a reference memory cell, and a sense amplifier in a general semiconductor flash memory.
Figure 19:
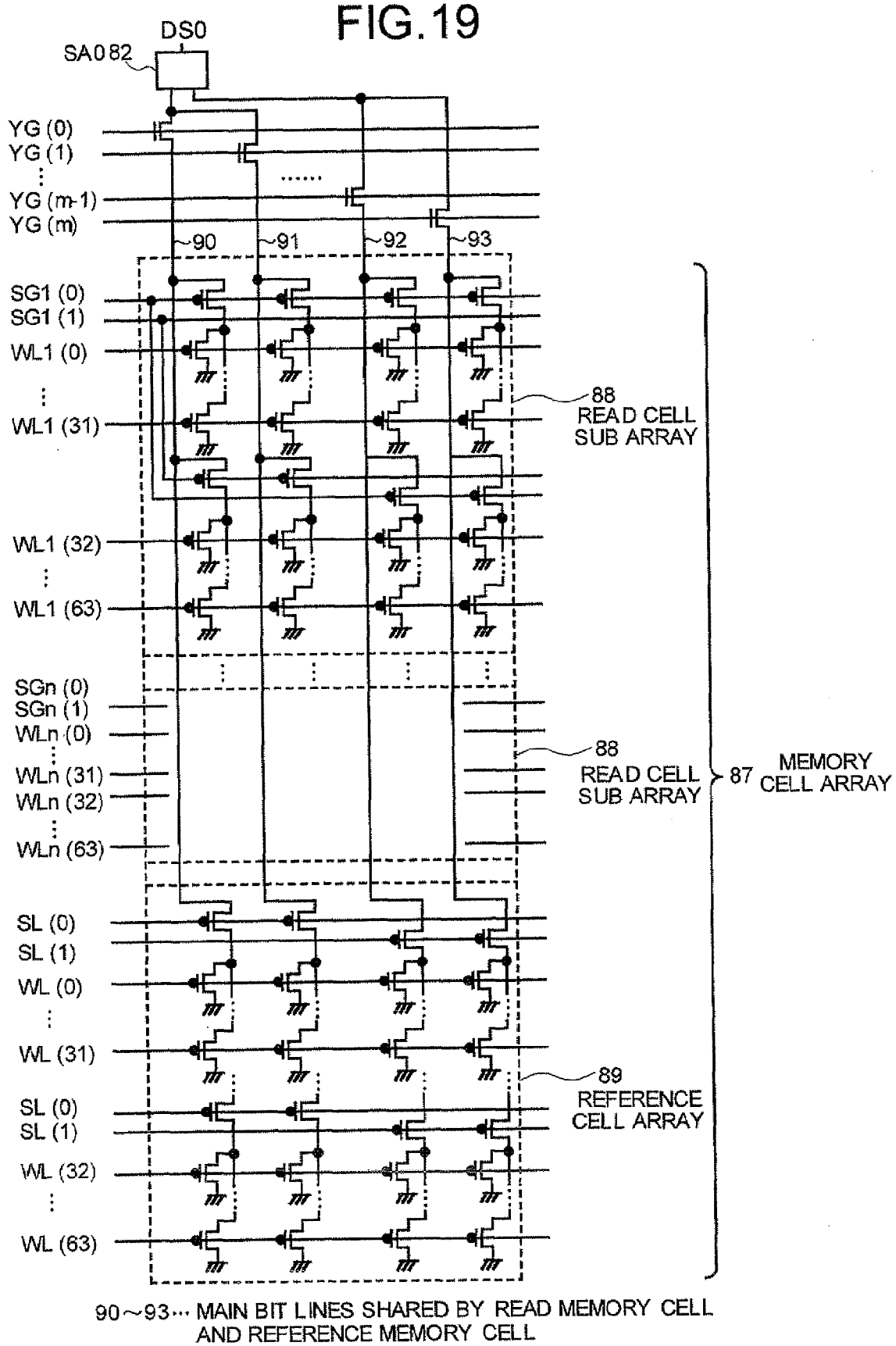
FIG. 19 is a circuit diagram (1) of a read circuit of a semiconductor flash memory according to a fifth embodiment of the present invention.
Figure 20:
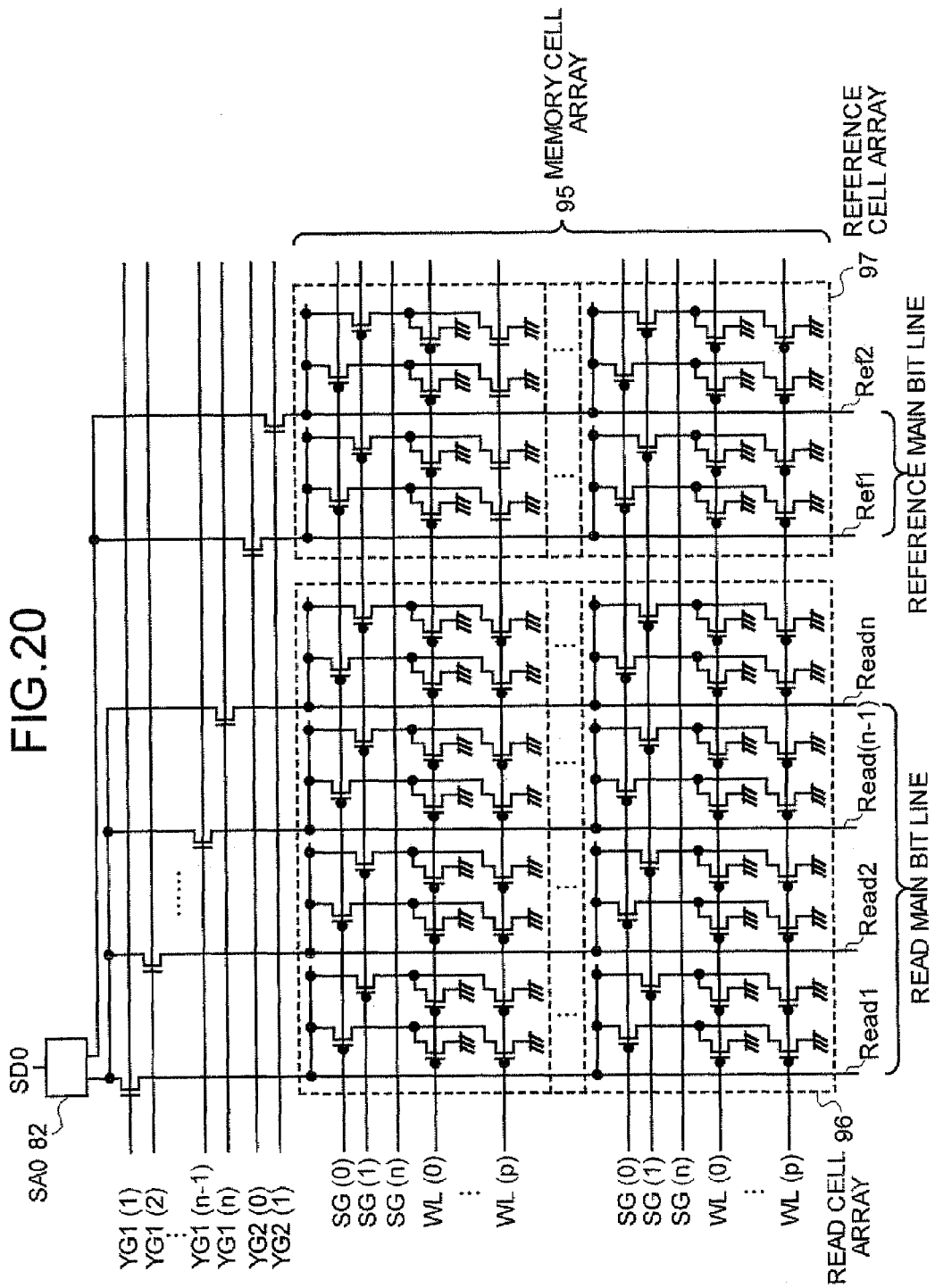
FIG. 20 is a circuit diagram (2) of a read circuit of a semiconductor flash memory according to a fifth embodiment of the present invention.
Figure 21:
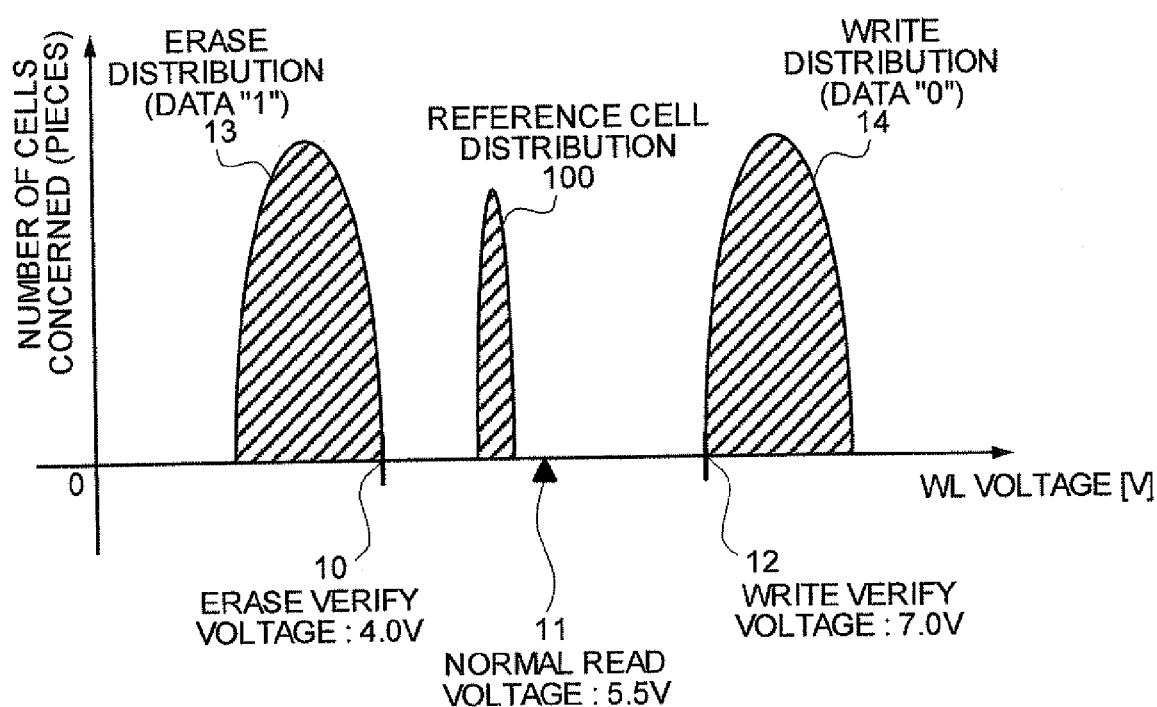
FIG. 21 is a graph for illustrating an example of write/erase verify voltage setting and memory threshold distribution at write/erase operation and memory threshold distribution of a reference memory cell in the semiconductor flash memories shown in FIG. 19 and FIG. 20.

In a fifth embodiment of the present invention, an example of the configuration in which a reference memory cell that supplies reference current to a sense amplifier is arranged in a same memory array as a read memory cell. In concrete, FIG. 18 is a schematic for illustrating a relation between a read memory cell, a reference memory cell, and a sense amplifier in a general semiconductor flash memory. FIG. 19 and FIG. 20 are block diagrams showing the basic configuration of a read circuit of a semiconductor flash memory as a fifth embodiment of a semiconductor flash memory according to the present invention FIG. 21 is a graph for illustrating an example of write/erase verify voltage setting and memory threshold distribution at write/erase operation and memory threshold distribution of a reference memory cell in the semiconductor flash memories shown in FIG. 19 and FIG. 20.

As shown in FIG. 18, in a general semiconductor flash memory, a read cell array 80 comprises plural units of a read sub array 81 that consists of the read memory cells that are controlled by select gate lines SG (SG (0) to SG (n)) and word lines WL (WL (0) to WL (p)). Each read sub array 81 is connected to plural read main bit lines 84 that are controlled by Y gate lines YG (YG (1) to YG (m)). Further, to this read cell array 80, sense amplifiers (SA0 to SAq) 82 and a reference cell array 83 consisting of plural reference memory cells are arranged.

In the reference cell array 83, one reference memory cell is selected by select lines SL (SL (0), SL (1)) and the word lines WL (WL (0) to WL (p)), and the selected reference memory cell is connected to a reference main bit line 85. The sense amplifier 82 is a differential amplifier for high speed read and is equipped with a general precharge circuit. To one input end of the sense amplifier 82, the read main bit lines 84 that are controlled by Y gate lines YG (YG (1) to YG (m)) are connected in parallel, and to the other input end thereof, the reference main bit line 85 from the reference cell array 83 is connected.

The sense amplifier 82 precharges the read main bit lines 84 and the reference main bit line 85 up to a certain potential before performing read, however, as is understood from the configuration in FIG. 18, the distance from the sense amplifier 82 to the read memory cells differs from that to the reference memory cell, as a result, loads of bit lines are different mutually, therefore, the configuration appears to be one not suitable for high speed read by the sense amplifier as a differential amplifier. In addition, the reference cell array 83 is of a configuration in which data written initially is kept as it is, and has nothing to do with gm degradation that occurs in the read cell array 80, therefore, differences occur in characteristics of both the arrays, as a result, there have been problems including difficulties in securing read margin and so forth.

Accordingly, in this fifth embodiment, a reference memory cell that has a threshold value between the erase threshold upper limit value and the write threshold lower limit value of read memory cell (Refer to FIG. 21.) is arranged, for example as shown in FIG. 19 and FIG. 20, in a same memory cell array as the read memory cells. In FIG. 19, an example is shown in which n pieces of read sub array 88 and one reference cell array 89 are connected to one sense amplifier 82, and the read memory cells and the reference memory cell are arranged in a same memory cell array 87. In FIG. 20, another example is shown in which a reference memory cell as a configuration component of a memory block is arranged together with a read memory cell in a same well, and n pieces of read cell array 96 and two pieces of reference cell array 97 are connected to one sense amplifier 82, and the read memory cells and the reference memory cell are arranged in a same memory cell array 95.

In FIG. 19, for example, to one input end of the sense amplifier 82, two main bit lines 90 and 91 that are controlled by YG (0) and YG (1) of Y gate lines YG are connected in parallel, while to the other input end of the sense amplifier 82, two main bit lines 92 and 93 that are controlled by YG (m-1) and YG (m) of Y gate lines YG are connected in parallel. In addition, to four main bit lines 90, 91, 92, and 93, n pieces of cell sub array 88 are connected in parallel, and one reference cell array 89 is arranged so as to terminal the four main bit lines 90, 91, 92, and 93.

In concrete, for example, when n pieces of read cell sub array 88 are to be controlled respectively by two select gate lines SG (0) and SG (1) and 64 word lines WL (0) to WL (63), in the main bit lines 90 and 91, by the select gate line SG (0), read memory cells to be connected to the word lines WL (0) to WL (31) may be selected, and by the select gate line SG (1), read memory cells to be connected to the word lines WL (32) to WL (63) may be selected. On the contrary, in the main bit lines 92 and 93, by the select gate line SG (1), read memory cells to be connected to the word lines WL (0) to WL (31) may be selected, and by the select gate line SG (0), read memory cells to be connected to the word lines WL (32) to WL (63) may be selected.

While, in the reference cell array 89, when each of the four main bit lines 90, 91, 92, and 93 is to be controlled by two select lines SL (0) and SL (1) and 64 word lines WL (0) to WL (63), in the main bit lines 90 and 91, by the select line SL (0), read memory cells to be connected to the word lines WL (0) to WL (31) may be selected, and by the select line SL (1), read memory cells to be connected to the word lines WL (32) to WL (63) may be selected. On the contrary, in the main bit lines 92 and 93, by the select line SL (1), read memory cells to be connected to the word lines WL (0) to WL (31) may be selected, and by the select line SL (0), read memory cells to be connected to the word lines WL (32) to WL (63) may be selected.

According to this configuration, for example, when the main bit line 90 is selected by the Y gate line YG (0), by operating either the select gate line SG (0) or the select gate line SG (1) of the read cell sub array 88, and selecting one of the word lines WL1 (0) to WL (31), one read memory cell of the read cell sub array 88 is connected via the main bit line 90 to one input end of the sense amplifier 82. On the other hand, in the reference cell array 89, by selecting the select line SL (0) to select the word lines WL (32) to WL (63), or selecting the select line SL (1) to select the word lines WL (0) to WL (31), it is arranged so that the reference memory cell 89 and the main bit line 90 should not be connected. At this moment, the main bit line 90 becomes a read main bit line.

At the same time, when the main bit line 93 is selected by the Y gate line YG (m)$_1$ either the select gate line SG1 (0) or the select gate line SG1 (1) of the read cell sub array 88 is operated, and one of the word lines WL1 (0) to WL1 (31) is selected, therefore, read memory cells of the read cell sub array 88 are not connected to the main bit line 90, on the other hand, in the reference cell array 89, the select line SL (0) is selected to select the word lines WL (32) to WL (63), or the select line SL (1) is selected to select the word lines WL (0) to WL (31), therefore the reference memory cell 89 and the main bit line, 93 are connected with each other, and are connected to one input end of the sense amplifier 82. At this moment, the main bit line 93 becomes a reference main bit line.

Further, when the main bit line 90 is selected by the Y gate line YG (0), and the select gate line SG1 (0) of the read cell sub array 88 is operated, and by the Y gate line YG (m), the main bit line 93 is selected and the select line SL (0) of the reference cell array 89 is operated, one read memory cell to be connected to one of the word lines WL1 (0) to WL1 (31), and one reference memory cell to be connected to one of the word lines WL (32) to WL (63) are connected to the sense amplifier 82.

While, when the main bit line 90 is selected by the Y gate line YG (0), and the select gate line SG1 (1) of the read cell sub array 88 is operated, and by the Y gate line YG (m), the main bit line 93 is selected and the select line SL (1) of the reference cell array 89 is operated, one read memory cell to be connected to one of the word lines WL1 (0) to WL (31), and one reference memory cell to be connected to one of the word lines WL (32) to WL (63) are connected to the sense amplifier 82.

As mentioned above, the four main bit lines 90, 91, 92, and 93 become common bit lines that respectively become read main bit lines to the read cell sub array 88, and become reference main bit lines to the reference cell array 89 respectively. Precharge by the sense amplifier 82 is performed by setting the four main bit lines 90, 91, 92, and 93 to read main bit lines respectively, and by setting them to reference main bit lines. Thereby, it is possible to make same the bit line load of the read main bit lines and that of the reference main bit lines to the sense amplifier 82, therefore, a configuration suitable for high speed read by differential amplification may be obtained.

Herein, erase sequence and write sequence, whose details are to be described later herein, are carried out separately and independently in the read cell sub array 88 and in the reference cell array 89. In the read cell sub array 88, many times of erase/write actions are performed, while in the reference cell array 89, the case to keep an initial value as it is after initial setting, and the case to carry out erase/write actions at appropriate time may be adopted. In the latter case to carry out erase/write actions at appropriate time, it is possible to eliminate characteristic displacement between the reference memory cell and the read memory cell under gm degradation environment.

In the next place, in FIG. 20, for example, as Y gate lines YG, n pieces of Y gate lines YG1 (1) to YG1 (n) for read memory and two Y gate lines YG2 (0) to YG2 (1) for reference memory are prepared. Then, to one input end of the sense amplifier 82, n pieces of main bit lines Read1 to Readn that are controlled by the Y gate lines YG (1) to YG 1 (n) are connected in parallel, while to the other input end of the sense amplifier 82, two reference main bit lines Ref1 and Ref2 that are controlled by the YG2 (0) and YG2 (1) of the Y gate lines YG. To the n pieces of the read main bit lines Read1 to Readn, a read cell array 96 consisting of the read cell sub arrays is connected, and to the two reference main bit lines Ref1 and Ref2, a reference cell array 97 consisting of plural reference cell sub arrays is connected.

According to this configuration, precharge by the sense amplifier 82 is carried out individually for n pieces of read main bit lines Read1 to Readn and two reference main bit lines Ref1 and Ref2, while the read cell array 96 and the reference cell array 97 are arranged in a same memory cell array, therefore it is possible to make the bit line load of the read main bit lines same as that of the reference main bit lines to the sense amplifier 82, consequently a configuration suitable for high speed read by differential amplification may be obtained.

While, with regard to erase sequence and write sequence, whose details are described later herein, because the read cell array 96 and the reference cell array 97 are arranged in a same well, when erase sequence is carried out, the read cell array 96 and the reference cell array 97 are erased simultaneously. In concrete, it is possible to eliminate characteristic displacement between the reference memory cell and the read memory cell under gm degradation environment.

In the next place, in reference to FIG. 21 too, erase sequence and write sequence are explained hereinafter. In the erase sequence to the memory cell arrays 87 and 95, actions in which erase pulse is given and erase verify is carried out are repeated and thereby memory threshold voltage is decreased gradually, and at the moment when the threshold voltage of all the memory cells in one block goes down below the erase verify voltage 10, application of erase pulse is completed. At this moment, in the semiconductor flash memory shown in FIG. 20, because the reference cell array 97 is arranged in the same well as the read cell array 96, when the read cell array 96 is erased, the reference sub array 97 is erased at the same time. While, in the semiconductor flash memory shown in FIG. 19, only the read cell sub array 88 is erased, therefore, the same erase sequence is carried out to the reference cell array 89.

In the next place, write to the reference cell arrays 89 and 97 is carried out, and as shown in FIG. 21, the threshold voltage of the reference memory cell distribution 100 is set to the side nearer to the normal read voltage 11 between the normal read voltage 11 and the erase verify voltage 10. This threshold value setting may be realized by the process in which the application WL voltage to the reference memory cell is made lower than that at normal write actions, and the write pulse width to the reference memory cell is made narrower, and so forth is carried out, and thereby, write is carried out step by step and verify is carried out so that a specified threshold value should not be exceeded.

In write sequence to the memory cell arrays 87 and 95, actions in which write pulse is given and write verify is carried out are repeated and the memory threshold voltage is increased gradually, and at the moment when the threshold voltage of the memory cell concerned goes over the write verify voltage 12, write pulse application is completed.

As mentioned above, according to the fifth embodiment, it is possible to equalize the bit line loads as two inputs of the sense amplifier, therefore, a semiconductor flash memory suitable for high speed read may be obtained. In addition, because the reference memory cell may be arranged under the same gm degradation environment as the read memory cell, it is possible to make large the difference between the memory current and the reference current. In concrete, it is possible to secure read margin to a specified value, and to keep read speed at high speed, and in addition, it is possible to increase the number of rewrite guarantee times.

It is known that, in an NOR type semiconductor flash memory, because the word line voltage and the main bit line voltage at read actions become of voltage arrangement with the same polarity as at write actions, as read actions are repeated, erase memory cells are written gradually, and a phenomenon leading to mistake read will occur. While it is also known that, on the contrary, in unselected memory cells on a same main bit line, when the word line voltage is 0V, positive polarity voltage works on only the main bit line, electrons that collect on a floating gate go to the drain side, and the threshold voltage of write memory cells will go down.

In this case, in the configuration shown in FIG. 19, one piece of reference memory cell is arranged to n pieces of read sub array. While, in the configuration shown in FIG. 20, two reference bit lines are arranged to n pieces of read bit line. In concrete, the expected value of read frequency of the reference memory cell becomes n times, and n/2 times respectively in comparison with the read memory cell. Therefore, in the arrangement configuration of the above reference cell arrays 89 and 97, when read actions are repeated respectively therein, there is a fear that the predetermined threshold voltage may fluctuate.

Therefore, for example, in the case having a built-in micro computer, when the semiconductor flash memory is not accessed such as at the moment of access to an SRAM, a signal is given on the background and the reference memory cell is read, and if the threshold voltage is lower than the target value, additional write is carried out. In this case, too, as same manner as write after erase, the process in which the application WL voltage to the reference memory cell is made lower than that at normal write actions, and the write pulse width to the reference memory cell is made narrower, and so forth is carried out, and thereby, write is carried out step by step and verify is carried out so that a specified threshold value should not be exceeded.

While, when the semiconductor flash memory is not accessed, a signal is given on the background and the reference memory cell is read, and if the threshold voltage is higher than the target value, voltage is impressed so that the potential difference between the word line voltage and the main bit line voltage should be, for example around −15V, and electrons in the floating gate are drawn out thereby, and erase per bit is carried out until the specified threshold voltage shown in FIG. 21 is attained. By carrying out these additional write and erase per bit, it is possible to keep constant the threshold voltage of the reference cell array, in the same manner, it is possible to keep read speed at high speed.

In the configuration shown in FIG. 20, it is possible for the reference cell array to have plural reference main bit lines. Thereby, one line may be used for actual reference, and others may be used as spares and the above additional write and erase per bit are carried out to the spare reference bit lines, and at the moment when the additional write and erase per bit are completed, the spare reference main bit lines and the reference main bit line in use are switched. Then, reference memory cells of the reference main bit line that was in use are read one after another, and according to the threshold voltage, additional write and erase per bit are carried out. Thereby, it is possible to increase the reliability of the reference memory cell.

The above is the case to carry out additional write and erase per bit of the reference main bit line, while, the same measure may be taken for the read main bit line. In concrete, read action is carried out while the semiconductor flash memory is not accessed, and for example, when the write verify voltage is 7V, and the threshold voltage of selected memory cell is 6.7 V to 7.0 V or so, then additional write is carried out to the memory cell having a threshold value lower than write verify voltage. While, for example, when the erase verify voltage is 4V, and the threshold voltage of selected memory cell is 4.0 V to 4.3 V or so, then erase per bit is carried out to the memory cell having a threshold value higher than erase verify voltage.

As mentioned above, according to the fifth embodiment, in the read memory cell and the reference memory cell, it is possible to eliminate characteristic changes owing to read actions, and to keep the threshold voltage difference between the initially set read memory cell and the reference memory cell at read actions at a specified value, as a result, it is possible to keep read speed at a high speed. Furthermore, it is possible to increase the number of rewrite guarantee times.

As explained above, in the semiconductor flash memory according to the present invention, by simply adding to the read control circuit the function to divide a memory array that is generally used as a read cell array into a memory block of "plural cells/1 bit configuration" and a memory block of "1 cell/1 bit configuration" and thereby controlling them, the memory block of "plural cells/1 bit configuration" and the memory block of "1 cell/1 bit configuration" may be arranged together therein.

This configuration is effective to reduce costs in applications in which high reliability is required for a semiconductor flash memory. In concrete, if the amount of data requiring frequent rewrite operations is relatively small, the data area may be made as a highly reliable block of "plural cells/1 bit configuration", and other data area in which the number of rewrite operations is relatively small may be made as a normally reliable block of "1 cell/1 bit configuration".

However, in order to realize the above, it is necessary to solve the following problems. Plural erase blocks existing in a semiconductor flash memory, and there are highly reliable blocks and one or more normally reliable blocks, new plural block layouts must be configured because decoding methods of word lines are different. It leads to lose reusability of layouts.

Further, attention must be paid to the fact that selecting the plural word lines may degrade access speed. When plural word lines are selected simultaneously, the load to be driven becomes plural times larger compared to the load in the case of selecting a single word line. In a block in which the plural word lines are selected simultaneously, fan-out of a drive circuit should not become extremely large compared to the block in which a single word line is selected. Otherwise, it must be necessary to change read timings according to blocks to access, which makes a semiconductor flash memory difficult to use.

Therefore, in a sixth embodiment and a seventh embodiment shown below, when to arrange in mixture plural blocks that secures high reliability by holding 1 bit data in the plural cells, and a normally reliable block of 1 bit/1 cell whose reliability is not high but bit cost is inexpensive, a configuration example of a semiconductor flash memory that may maintain high speed access, and can realize reusability of a preferred circuit layout between the highly reliable block and the normally reliable block is shown hereinafter.

Figure 22:
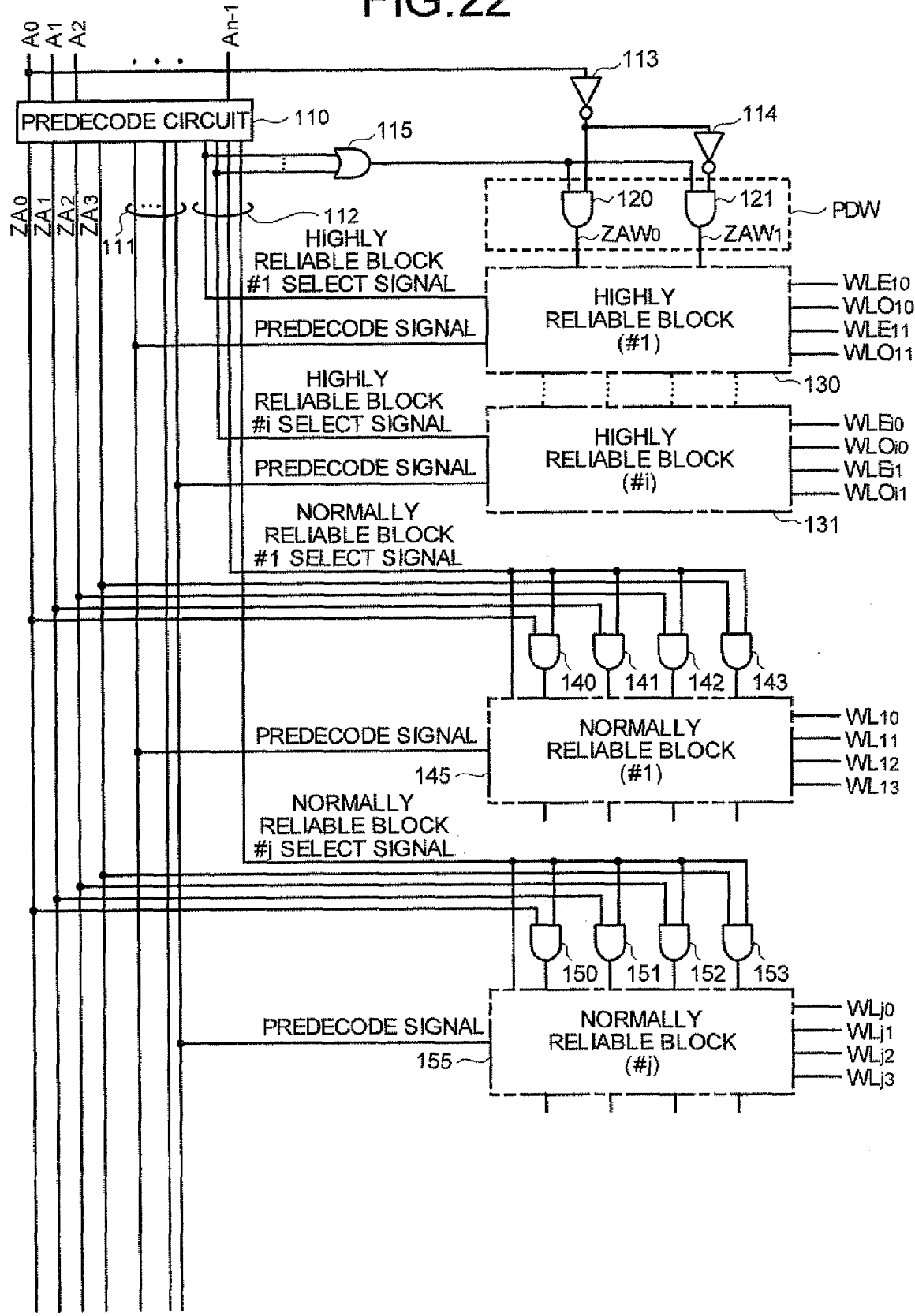
FIG. 22 is a circuit diagram of a word-line decoder circuit of a semiconductor flash memory according to a sixth embodiment of the present invention.
Figure 23:
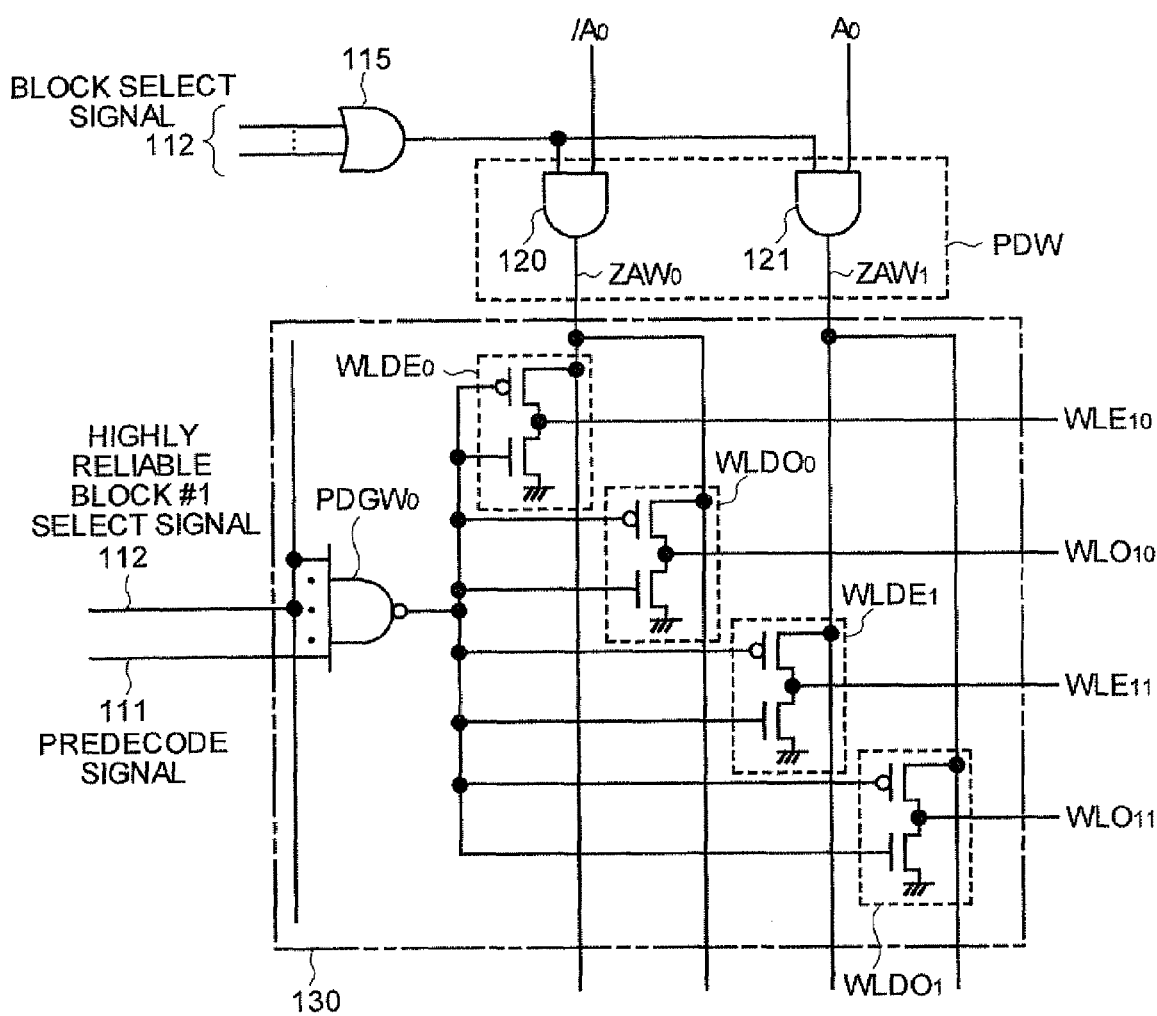
FIG. 23 is a circuit diagram of a highly reliable block shown in FIG. 22.
Figure 24:
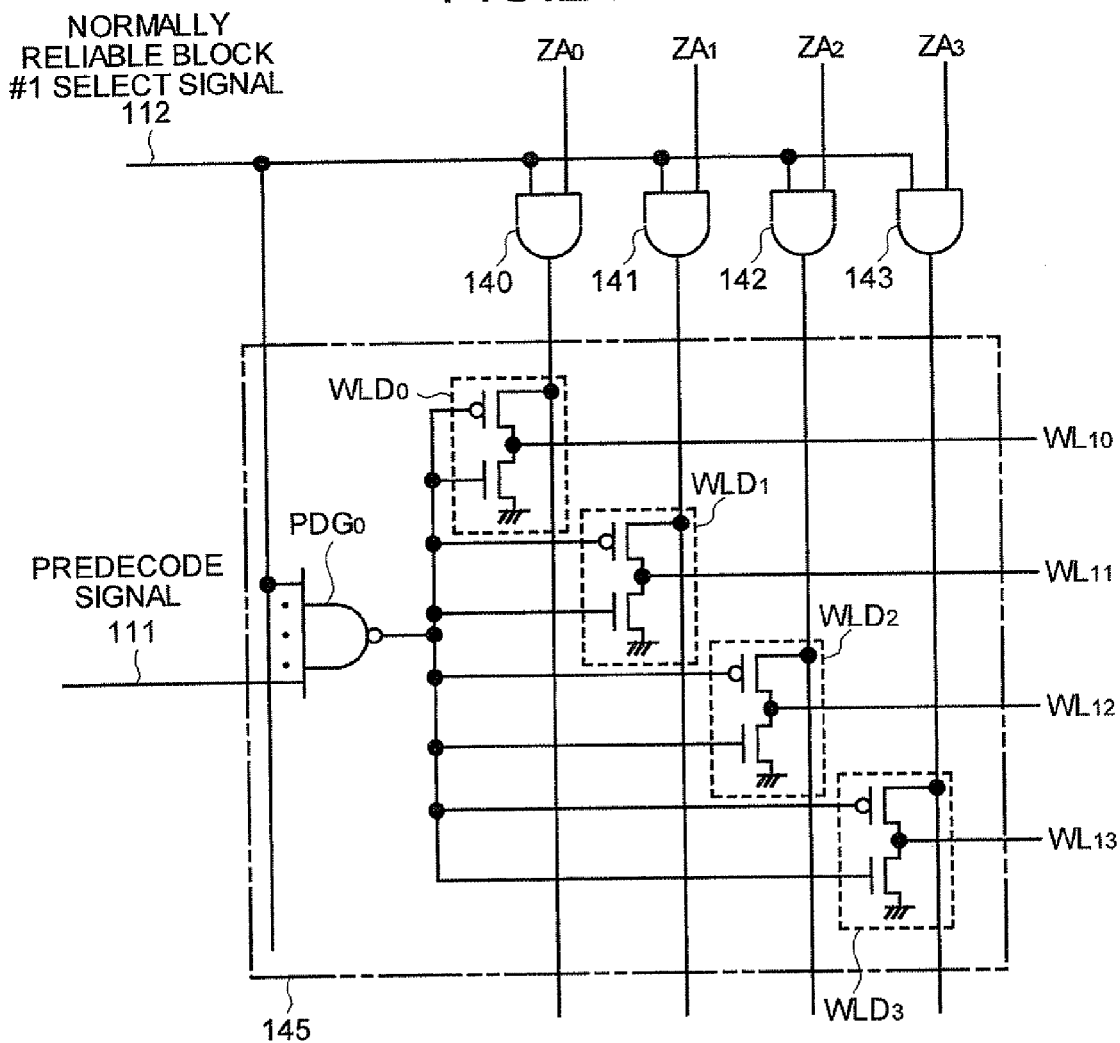
FIG. 24 is a circuit diagram of a normally reliable block shown in FIG. 22.

FIG. 22 is a circuit diagram of a word-line decoder circuit of a semiconductor flash memory according to a sixth embodiment of the present invention. FIG. 23 is a circuit diagram of a highly reliable block shown in FIG. 22. FIG. 24 is a circuit diagram of a normally reliable block shown in FIG. 22.

In FIG. 22, a predecoder circuit 110 outputs predecode signals $ZA_0$ to $ZA_3$ in which 2-bit LSB side addresses $A_0$ to $A_1$ among addresses $A_0$ to $A_{n-1}$ are predecoded, other predecode signals 111 and block select signals 112 in which addresses $A_2$ to $A_{n-1}$ are predecoded. Here, predecode signals $ZA_0$ to $ZA_3$ are signals used as block addresses, and inversion signals thereof are expressed with "/" as, $ZA_0=/A_0\cdot/A_1$, $ZA_1=/A_0\cdot A_1$, $ZA_2=A_0\cdot/A_1$, and $ZA_3=A_0\cdot A_1$.

($i \geqq 2$) pieces of highly reliable block (#1) 130 to highly reliable block (#i) 131 and j($j \geqq 1$) pieces of normally reliable block (#1) 145 to normally reliable block (#j) 155, placed adjacent to one another, even if they are mixed in the logical address space thereof. And the highly reliable block (#1) 130 to highly reliable block (#i) 131 are, respectively, configured as shown in FIG. 23, while the normally reliable block (#1) 145 to normally reliable block (#j) 155 are, respectively, configured as shown in FIG. 24. In FIG. 22 and after, in each of the blocks, only four word lines are shown for simplicity however in fact, further more word lines exist therein.

A predecoder circuit PDW is shared by i pieces of highly reliable block (#1) 130 to highly reliable block (#i) 131. The predecoder circuit PDW, in this sixth embodiment, comprises two AND circuits 120 and 121. The logical sum of highly reliable block #1 select signal to highly reliable block #i select signal of a block select signal 112 is taken by an OR circuit 115 and input to one terminal of the AND circuits 120 and 121. While, to the other input terminal of the AND circuit 120, an address $/A_0$ in which the least significant address $A_0$ is inverted by an inverter 112 is applied. On the other hand, to the other input terminal of the AND circuit 121, an address $A_0$ in which the output of the inverter 113 is further inverted and applied. Predecode signals $ZAW_0$ and $ZAW_1$ as the outputs of the AND circuits 120 and 121 are supplied in common to i pieces of highly reliable block (#1) 130 to highly reliable block (#i) 131.

In addition, to i pieces of highly reliable block (#1) 130 to highly reliable block (#i) 131, the block select signal 112 and a predecode signal 111 are input. FIG. 23 shows the configuration of the highly reliable block (#1) 130 as a representative example. In the highly reliable block (#i) 130, four word line drivers $WLDE_0$, $WLDO_0$, $WLDE_1$, and $WLDO_1$, and a predecoder circuit $PDGW_0$ are equipped.

The power source terminals of the word line drivers $WLDE_0$ and $WLDO_0$ are connected in common to the output terminal of the AND circuit 120, while the power source input terminals of the word line drivers $WLDE_1$ and $WLDO_1$ are connected in common to the output terminal of the AND circuit 121. The gate terminals of the four word line drivers $WLDE_0$, $WLDO_0$, $WLDE_1$ and $WLDO_1$ are connected in parallel to the output terminal of the predecoder circuit $PDGW_0$.

The highly reliable block #1 select signal 112 and the predecode signal 111 are input to the predecoder circuit $PDGW_0$. The predecoder circuit $PDGW_0$ takes the logical product of the highly reliable block #1 select signal 112 and the predecode signal 111 and thereby activates or inactivates the gate terminals of the four word line drivers $WLDE_0$, $WLDO_0$, $WLDE_1$ and $WLDO_1$ simultaneously.

To the power source terminals of the word line drivers $WLDE_0$ and $WLDO_0$, the predecode signal $ZAW_0$ is connected in common, while to the power source terminals of the word line drivers $WLDE_1$ and $WLDO_1$, the predecode signal $ZAW_1$ is connected in common. Therefore, the word lines $WLE_{10}$ and $WLO_{10}$ are selected as a pair, and the word lines $WLE_{11}$ and $WLO_{11}$ are selected as a pair.

As mentioned above, because two word lines are selected simultaneously, it is possible to select two memory cells to which identical data has been written in prior and connect them to a same bit line. Thereby, memory cell current of two memory cells drives the bit line, it is possible to make the conductance gm of memory cell double effectively.

On the other hand, in the normally reliable block (#1) 145 to normally reliable block (#j) 155, only one word line is selected by predecode signals $ZA_0$ to $ZA_3$. In concrete, in the normally reliable block (#1) 145, the normally reliable block #1 select signal in the block select signal 112 and a predecode signal corresponding thereto in other predecode signal 111 are input, and in the four AND circuits 140 to 143, the four predecode signals that take the logical product of the predecode signals $ZA_0$ to $ZA_3$ and the normally reliable block #1 select signal are input, and only one of the power source terminals of the word line drivers that drive the four word lines $WL_{10}$, $WL_{11}$, $WL_{12}$, and $WL_{13}$ is selected.

While, in the normally reliable block (#j) 155, the normally reliable block #j select signal in the block select signal 112 and a predecode signal corresponding thereto in other predecode signal 111 are input, and in four AND circuits 150 to 153, the four predecode signals that take the logical product of the predecode signals $ZA_0$ to $ZA_3$ and the normally reliable block #j select signal are input, and only one of the power source side terminals of the word line drivers that drive the four word lines $WL_{j0}$, $WL_{j1}$, $WL_{j2}$, and $WL_{j3}$ is selected.

FIG. 24 shows the configuration of the normally reliable block (#1) 145 as a representative example. In the normally reliable block (#1) 145, four word line drivers $WLD_0$, $WLD_1$, $WLD_2$, and $WLD_3$ and a predecoder circuit $PDG_0$ are equipped.

The power source terminal of the word line driver $WLD_0$ is connected to the output terminal of the AND circuit 140, and the power source terminal of the word line driver $WLD_1$ is connected to the output terminal of the AND circuit 141, and the power source terminal of the word line driver $WLD_2$ is connected to the output terminal of the AND circuit 142, and the power source input terminal of the word line driver $WLD_3$ is connected to the output terminal of the AND circuit 143. The gate terminals of the four word line drivers $WLD_0$, $WLD_1$, $WLD_2$, and $WLD_3$ are connected to the output terminal of the predecoder circuit PDG0 in parallel.

The normally reliable block #1 select signal 112 and the predecode signal 111 are input to the predecoder circuit $PDG_0$. The predecoder circuit $PDG_0$ takes the logical product of the normally reliable block #1 select signal 112 and the predecode signal 111 and activates or inactivates the gate side input terminals of the four word line drivers $WLD_0$, $WLD_1$, $WLD_2$ and $WLD_3$ simultaneously.

With regard to the predecode signals $ZA_0$ to $ZA_3$ as the power source terminals of the word line drivers $WLD_0$ to $WLD_3$, only one is activated according to addresses $A_0$ and $A_1$, therefore, only one word line is selected.

As explained above, according to the sixth embodiment, by sharing the predecode signals $ZAW_0$ and $ZAW_1$ in two or more highly reliable blocks, the predecoder circuit PDW can be shared. Consequently, it is possible to reduce the layout area. Further, highly reliable blocks that share the predecode signals $ZAW_0$ and $ZAW_1$ are placed adjacent to each other. As predecode signals can be shared by two or more higher reliable blocks, the wire length of predecode signals can be reduced. Accordingly, it is possible to shorten the time from address change to rise of word lines. As a consequence, access time can be reduced.

Figure 25:
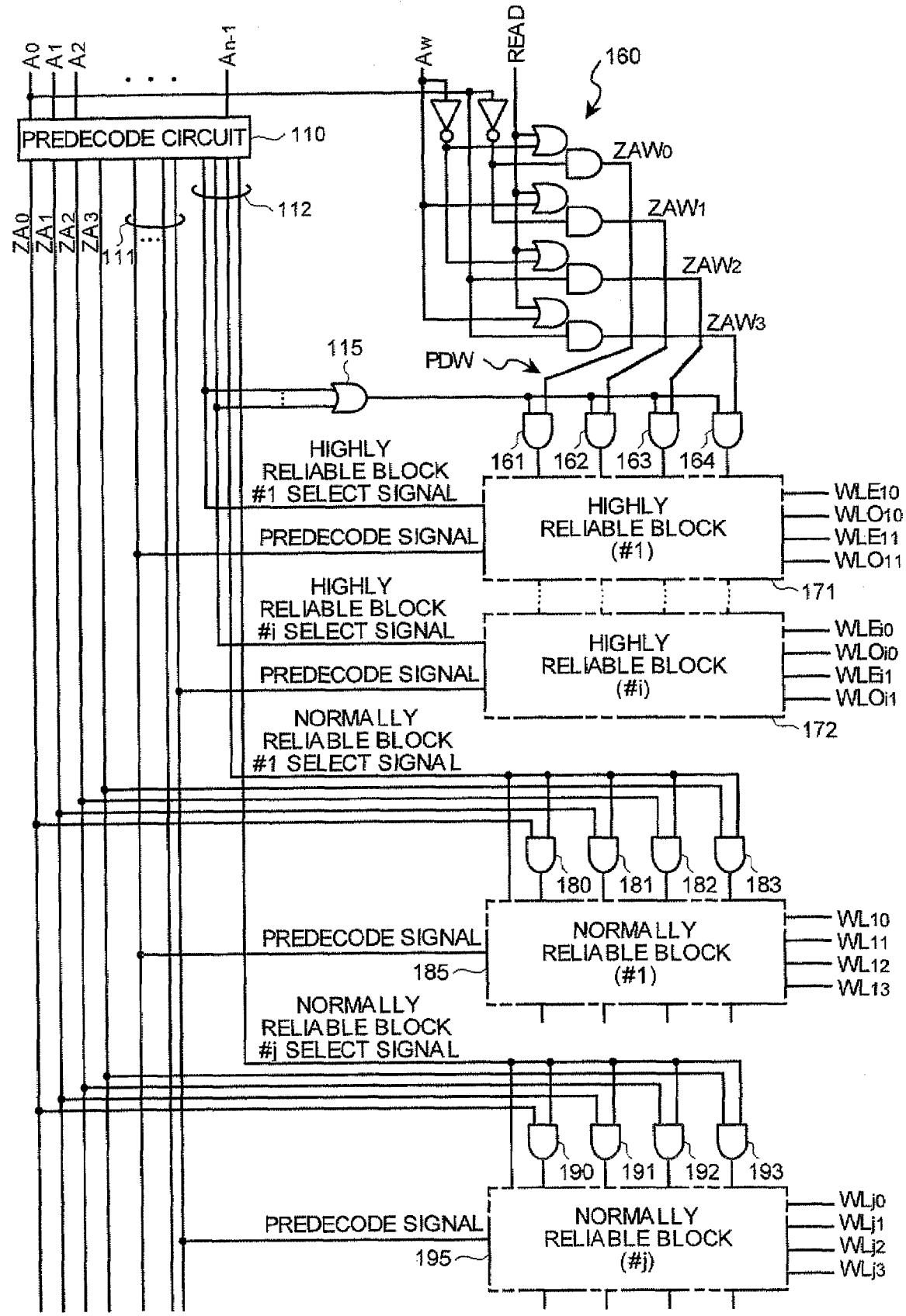
FIG. 25 is a circuit diagram of a word-line decoder circuit in a semiconductor flash memory according to a seventh embodiment of the present invention.
Figure 26:
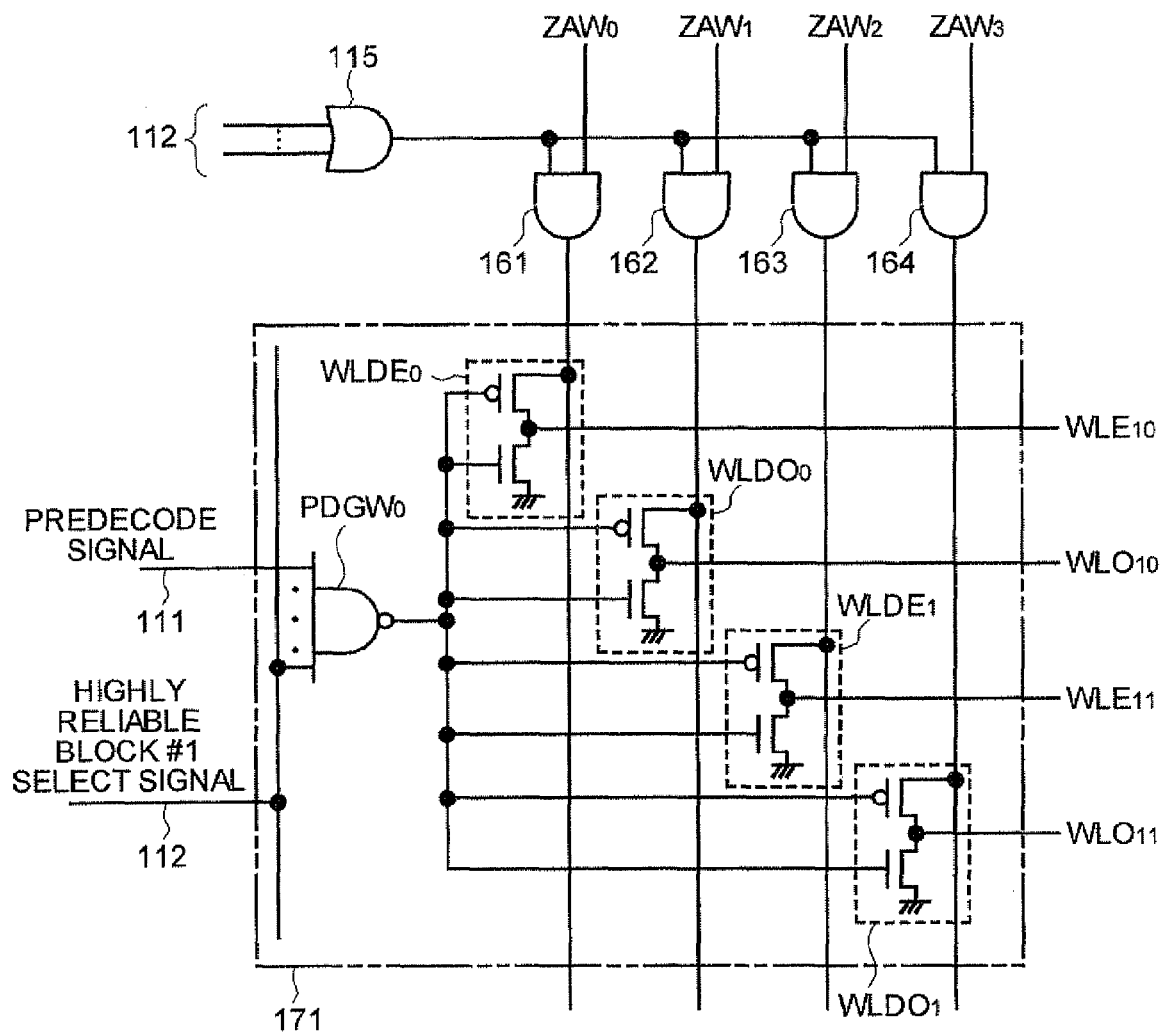
FIG. 26 is a circuit diagram of a highly reliable block shown in FIG. 25.
Figure 27:
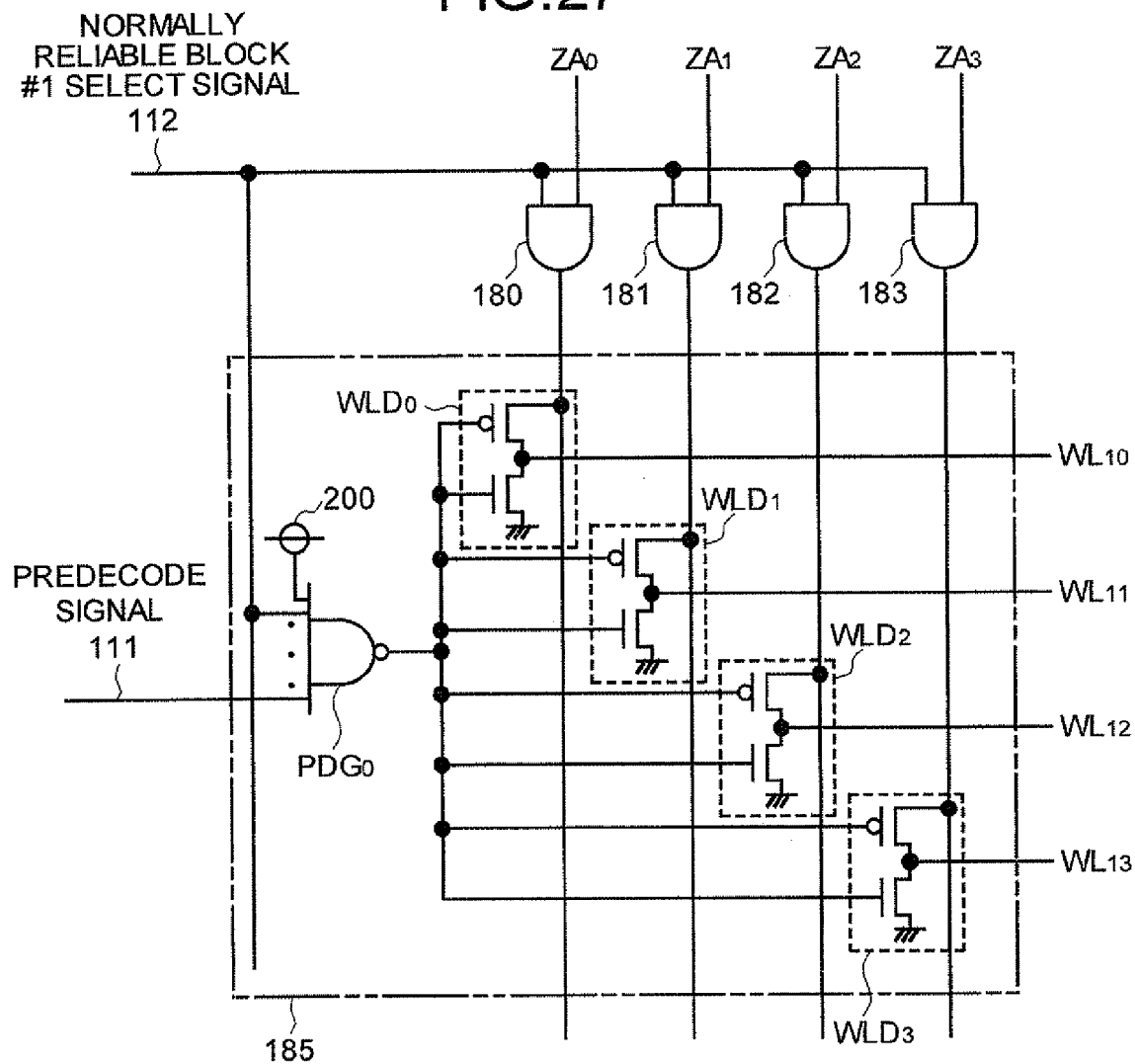
FIG. 27 is a circuit diagram of a normally reliable block shown in FIG. 25.

FIG. 25 is a circuit diagram of a word-line decoder circuit in a semiconductor flash memory according to a seventh embodiment of the present invention. FIG. 26 is a circuit diagram of a highly reliable block shown in FIG. 25. FIG. 27 is a circuit diagram of a normally reliable block shown in FIG. 25.

In the sixth embodiment (FIG. 22), the predecode signals $ZAW_0$ and $ZAW_1$ are respectively shared by two adjacent word line drivers, and in the highly reliable block, two word lines can be selected simultaneously, but they cannot be selected one by one. However, even in the highly reliable block, at write verify operation or write operation or so there are cases when it is preferable to individually select the memory cells to which identical data is to be programmed. Explanations are made with write operation as an example hereinafter.

In write operation, after write voltage is applied, write verify operation is carried out, to confirm whether the threshold voltage of the memory cell has increased over a determined value. Write verify operation is performed by selecting and reading memory cells of write objective. When the threshold voltage of the memory cell goes above the predetermined value, write voltage application is stopped, and write operation is completed. When the threshold voltage of the memory cell is lower than the predetermined value, write voltage is further applied and write operation is continued.

In write verify operation, if write verify is carried out under the same voltage conditions as in normal read action, there will be no margin at read operation. Therefore, for example, voltage higher than the voltage at normal read action is applied as write verify voltage to word lines, i.e., to gate electrodes of memory cells, and whether the memory cell current is smaller than the predetermined current value is examined.

In the write verify operation carried out in the process of write operation, if there is difference in threshold voltage values of the memory cells selected simultaneously, there is a possibility that the threshold voltage of only one of the plural memory cells does not increase sufficiently, while the threshold values of other memory cells increase sufficiently. In this case, if only one memory cell with a low threshold voltage flows current exceeding the predetermined judgment current value of write verify all the plural memory cells selected simultaneously are judged as insufficiently written. As a result, to other memory cells excluding the one memory cell with the low threshold voltage in the plural memory cells selected simultaneously, though they are sufficiently written, program voltage is applied on them collectively. Accordingly, there may be memory cells to which program voltage has been applied excessively. Such excessive program pulse will facilitate memory cell degradation, which spoils reliability of stored data.

Therefore, at read operation, even in the highly reliable block in which plural memory cells are selected simultaneously, it is preferred that plural memory cells holding identical data can be selected one by one at write verify operation and program pulse application. FIG. 25 is a circuit diagram showing a circuit configured from the above viewpoint. In FIG. 25, an identical code is allotted to the same or similar components as to the components shown in FIG. 22. Herein, the portion concerning to this seventh embodiment are explained.

As shown in FIG. 25, a predecoder circuit PDW that is arranged in common to i pieces of highly reliable block (#1) 170 to highly reliable block (#i) 171 is equipped with four AND circuits 161 to 164. In addition, to each one input terminal of the four AND circuits 161 to 164 of the predecoder circuit PDW, a predecoder circuit 160 that supplies predecode signals $ZAW_0$ to $ZAW_3$ is arranged. To each other input terminal of the four AND circuits 161 to 164, the output of an OR circuit 115 is input in common.

The predecoder circuit 160 is a combination circuit consisting of two inverters and four OR circuits and four AND circuits, and the least insignificant address $A_0$, an address AW and a READ signal are input thereinto. The least significant address $A_0$ is input to each input terminal of the two AND circuits among the four AND circuits. The least significant address $A_0$ is inverted by one inverter, and is input to each input terminal of the remaining two AND circuits.

The address AW is a binary level signal for identifying which of the two word lines selected as a pair as explained in the sixth embodiment at read action of the highly reliable block. The address signal AW is input to each one input terminal of the two OR circuits among the four OR circuits. In addition, the address signal AW is inverted by the remaining inverter, and is input to each one input terminal of the remaining two OR circuits. As the address AW has no relation with address decode of the normally reliable block.

The READ signal is a binary level signal that becomes H level at read operation, and becomes L level at other than read operation. This READ signal is input to terminal other input end of the four OR circuits. Each output terminal of these four OR circuits is connected to each corresponding other input end of the four AND circuits. Thereby, from the four AND circuits, predecode signals $ZAW_0$ to $ZAW_3$ are output.

Here, the predecode signals $ZAW_0$ to $ZAW_3$ become as follows:

$ZAW_0 = /A_0 \cdot (READ + /AW); ZAW_1 = A_0 \cdot (READ + AW);$ $ZAW_2 = A_0 \cdot (READ + /AW);$ and $ZAW_3 = A_0 \cdot (READ + AW).$ FIG. 26 shows the configuration of the highly reliable block (#1) 171 as a representative example. In the highly reliable block (#i) 171, four word line drivers $WLDE_0$, $WLDO_0$, $WLDE_1$, and $WLDO_1$, and a predecoder circuit $PDG_0$ are equipped. The gate terminals of the 4 word line drivers $WLDE_0$, $WLDO_0$, $WLDE_1$, and $WLDO_1$ are connected to the output terminal of the predecoder circuit $PDGW_0$ in parallel, which is same as in the sixth embodiment, while the connection relation of the power source terminals of the four word line drivers $WLDE_0$, $WLDO_0$, $WLDE_1$, and $WLDO_1$ is different.

In concrete, the power source terminal of the word line driver $WLDE_0$ is connected to the output terminal of the AND circuit 161. The power source terminal of the word line driver $WLDO_0$ is connected to the output terminal of the AND circuit 162. The power source terminal of the word line driver $WLDE_1$ is connected to the output terminal of the AND circuit 163. The power source terminal of the word line driver $WLDO_1$ is connected to the output terminal of the AND circuit 164.

Herein, the conditions for the word lines $WLE_{10}$, $WLO_{10}$, $WLE_{11}$, and $WLO_{11}$ should be selected are as shown below. It should be that $WLE_{10} = /A_{n-1} \ldots /A_0 \cdot /AW$. It should be that $WLO_{10} /A_{n-1} \ldots /A_0 \cdot AW$. It should be that $WLE_{11} = /_{n-1} \ldots A_0 \cdot /AW$. And, it should be that $WLO_{11} = A_{n-1} \ldots A_0 \cdot AW$.

In the configuration mentioned above, at other actions than normal read operation in which the READ signal is at L level, when the address AW and addresses $A_0$ to $A_{n-1}$ are all at L level, only the predecode signal $ZAW_0$ among the predecode signals $ZAW_0$ to $ZAW_3$ becomes H level, and the input terminals of the word line drivers $WLDE_0$, $WLDO_0$, $WLDE_1$, and $WLDO_1$ become H level. Therefore, only the word line $WLE_{10}$ becomes H level Consequently, only a single word line is selected.

While, when only the address AW is at H level, and the address $A_0$ to $A_{n-1}$ are all at L level, the gate terminals of the word line drivers $WLDE_0$, $WLDO_0$, $WLDE_1$, and $WLDO_1$ are at H level, and only the predecode signal ZAW1 among the predecode signals $ZAW_0$ to $ZAW_3$ becomes H level, as a result, only the word line $WLO_{10}$ is selected.

On the other hand, at normal read operation in which the READ signal is at H level, irrespective of whether the address AW is H level or L level, the word lines $WLE_{10}$, $WLO_{10}$, and the word lines $WLE_{11}$, $WLO_{11}$ are selected in pairs respectively. Accordingly, for example, when the addresses $A_0$ to $A_{n-1}$ are all at L level, the word lines $WLE_{10}$ and $WLO_{10}$ are selected as a pair, and two memory cells are selected simultaneously. While, when only the address $A_0$ is at H level, and the addresses $A_0$ to $A_{n-1}$ are all at L level, the word lines $WLE_{11}$ and $WLO_{11}$ are selected as pair, and in the same manner, two memory cells are selected simultaneously.

Herein, in the configuration in which two word lines are selected simultaneously at normal read operation, attention must be paid to the difference from the sixth embodiment. In concrete, in the sixth embodiment shown in FIG. 22, the power source terminals of the word line drivers that drive two word lines that are selected simultaneously are connected to a same predecode signal. For example, the power source terminals of the word line drivers $WLDE_0$ and $WLDO_0$ that drive the word lines $WLE_{10}$ and $WLO_{10}$ to be selected simultaneously are connected to the same predecode signal $ZAW_0$. In this case, the drive circuit (AND circuit 120) of the predecode signal $ZAW_0$ must drive parasitic load for two word lines via word line drivers. Accordingly, in order to realize a equivalent word line rise time in the normally reliable block and the highly reliable block, the drivability of the predecode signal driver must be determined carefully according to the parasitic load to drive.

In contrast, in this seventh embodiment, the power source side terminals of the word line drivers that drive two word lines that are to be selected simultaneously at normal read operation are connected to different predecode signals. In concrete, in the highly reliable block, the parasitic load of the word lines that the drive circuits (AND circuits 161 to 164) of the predecode signals $ZAW_0$ to $ZAW_3$ are for one word line, respectively, as same as the predecode signal driver used in the normally reliable block.

Accordingly, in this seventh embodiment, as the load of the predecode signal is equivalent to that of the predecode signal that is used in the normally reliable block, the drive circuits (AND circuits 161 to 164) of the predecode signals $ZAW_0$ to $ZAW_3$ that are used for decode in the highly reliable block can be of same drivability as that of the drive circuits (AND circuits 180 to 183) of the predecode signals $ZA_0$ to $ZA_3$ that are used in the normally reliable block.

On the other hand, with regard to the decode of the gate side input terminal of the word line driver in the highly reliable block, it is necessary to decode the addresses A1 to $A_{n-1}$ while in the normally reliable block, it is necessary to decode only the addresses $A_2$ to $A_{n-1}$ and the number of addresses to be predecoded in the normally reliable block is fewer by 1 bit. In other words, the number of inputs of NAND circuits to predecode the gate side input terminal of word line drivers is more by one line in the highly reliable block compared to normally reliable block.

Accordingly, when the normally reliable block is configured as shown in FIG. 27, the layout may be used in common in both the highly reliable block and the normally reliable block. However, in this case, the memory capacity of the highly reliable block becomes half of that of the normally reliable block. In concrete, one input terminal of the predecoder circuit $PDG_0$ is connected to a power source 200 and fixed to H level, then the layout may be used completely in common.

As mentioned above, according to the seventh embodiment, predecode signal is shared in two or more highly reliable block, and plural word lines, can be selected simultaneously, while, it is also possible to select word lines one by one in other modes. At this case, the layout may be used in common in both the highly reliable block and the normally reliable block, and further, the word line rise time thereof can be equivalent.

According to the present invention, even when degradation transconductance characteristics occurs in each memory cell owing to repetitions of erase/write operation, it is possible to prevent read speed from decreasing, and also to increase the number of rewrite times guaranteed. Further, it is possible to equalize bit line loads of a sense amplifier, furthermore, it is possible to keep the threshold voltage difference between initially set read memory cell and reference memory cell to a specified value, as a consequence, high speed read may be attained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor flash memory comprising:
   at least one first block that holds one bit of information in a single memory cell driven by only one word line that is selected when a data read operation is performed; and
   a plurality of second blocks that hold one bit of information in at least one memory cell driven by at least one word line, wherein
      when a normal data-read operation is performed, a plurality of word lines is selected simultaneously,
      when an operation other than the normal data-read operation is performed, one word line fewer than the number of word lines selected when the normal data-read operation is performed, is selected simultaneously, and
      the second blocks are arranged adjacent to each other, and configured so that each of the second blocks applies a common predecode signal to a power source side terminal of a word line driver to perform an operation for selecting a word line.

2. The semiconductor flash memory according to claim 1 further comprising a circuit that generates different predecode signals that are applied to power source side terminals of the word line drivers of each of the second blocks, based on a first control signal that distinguishes the normal data-read operation from the operation other than the normal data-read operation, and a second control signal that designates a word line to be selected at the operation other than the normal data-read operation from among the word lines that are selected in the normal data-read operation.

3. The semiconductor flash memory according to claim 2, wherein the second control signal is an address signal that individually designates the word lines that are selected at the normal data-read operation as word lines that may be selected at the operation other than the normal data-read operation.

4. The semiconductor flash memory according to claim 3, wherein the address signal is an address signal that is not used in the first block.

5. The semiconductor flash memory according to claim 1, wherein when a data-read operation is performed, a plurality of word lines is selected simultaneously, and the second blocks hold one bit of information in a plurality of memory cells driven by the word lines selected.

6. The semiconductor flash memory according to claim 5, wherein when there are a plurality of sets of the word lines selected simultaneously, the second blocks apply different predecode signals to the power source side terminal of a plurality of word line drivers for each of the sets.

* * * * *